United States Patent
Shingu et al.

(10) Patent No.: US 8,058,681 B2
(45) Date of Patent: Nov. 15, 2011

(54) NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT

(75) Inventors: Masao Shingu, Kawasaki (JP); Jun Fujiki, Yokohama (JP); Naoki Yasuda, Yokohama (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 12/405,626

(22) Filed: Mar. 17, 2009

(65) Prior Publication Data
US 2010/0034023 A1    Feb. 11, 2010

(30) Foreign Application Priority Data
Aug. 8, 2008 (JP) .................. 2008-206291

(51) Int. Cl.
*H01L 29/792* (2006.01)
(52) U.S. Cl. ................. 257/324; 257/E29.309
(58) Field of Classification Search ............ 257/324, 257/E29.309
See application file for complete search history.

(56) References Cited

U.S. PATENT DOCUMENTS
2005/0230766 A1*  10/2005  Nomoto et al. .............. 257/411
2008/0237699 A1   10/2008  Shimizu et al.

FOREIGN PATENT DOCUMENTS
JP    2007-35214    2/2007
JP    2007-193862   8/2007

OTHER PUBLICATIONS

Y.T. Hou, et al., "Quantum Tunneling and Scalability of $HfO_2$ and HfAlO Gate Stacks", IEDM, 2002, 4 pages.

Zhen Xu, Polarity effect on the temperature dependence of leakage current through $HfO_2/SiO_2$ Gate Dielectric Stacks, Applied Physics Letters, vol. 80, No. 11, Mar. 18, 2002, pp. 1975-1977.

Bogdan Govoreanu, et al., "On the Roll-Off of the Activation Energy Plot in High-Temperature Flash Memory Retention Tests and its Impact on Reliability Assessment", IEEE Electron Device Letters, vol. 29, No. 2, Feb. 2008, pp. 177-179.

Takashi Ando, et al., "Application of HfSiON to Deep-Trench Capacitors of Sub-45-nm-Node Embedded Dynamic Random-Access Memory". Japanese Journal of Applied Physics, vol. 45, No. 4B, 2006, pp. 3165-3169.

(Continued)

*Primary Examiner* — Matthew Reames
(74) *Attorney, Agent, or Firm* — Oblon, Spivak, McClelland, Maier & Neustadt, L.L.P.

(57) ABSTRACT

According to an aspect of the present invention, there is provided a nonvolatile semiconductor memory element including: a semiconductor substrate including: a source region; a drain region; and a channel region; a lower insulating film that is formed on the channel region; a charge storage film that is formed on the lower insulating film and that stores data; an upper insulating film that is formed on the charge storage film; and a control gate that is formed on the upper insulating film, wherein the upper insulating film includes: a first insulting film; and a second insulating film that is laminated with the first insulating film, and wherein the first insulating film is formed to have a trap level density larger than that of the second insulating film.

18 Claims, 9 Drawing Sheets

OTHER PUBLICATIONS

M. Houssa, et al., "Trap-Assisted Tunneling in High Permittivity Gate Dielectric stacks", Journal of Applied Physics, vol. 87, No. 12, Jun. 15, 2000, pp. 8615-8620.

Yang (Larr) Yang, et al., "Charge Retention of Scaled SONOS Nonvolatile Memory Devices at Elevated Temperatures", Solid-State Electronics 44, 2000, pp. 949-958.

K. Lehovec, et al., "Charge retention of MNOS Devices Limited by Frenkel-Poole Detrapping", Applied Physics Letter, vol. 32, No. 5, Mar. 1, 1978, pp. 335-338.

Christer Svensson, et al., "Trap-Assisted Charge Injection in MNOS Structures", Journal of Applied Physics, vol. 44, No. 10, Oct. 1973, pp. 4657-4663.

C. Oshima, et al., "The Surface Properties of TiC(001) and TiC(111) Surfaces", Journal of the Less-Common Metals 82, 1981, pp. 69-74.

Yasushi Saito, et al., "Emission Characteristics of Niobium Nitride Field Emitters", Applied Surface Science 146, 1999, pp. 177-181.

S. B. Samavedam, et al., "Metal Gate MOSFETs with $HfO_2$ Gate Dielectric", Symposium on VLSI Technology Digest of Technical Papers, 2002, 2 pages.

Dae-Gyu Park, et al., "Robust Ternary Metal Gate Electrodes for Dual Gate CMOS Devices", IEDM, 2001, 4 pages.

G. R. Gruzalski, et al., "Work-Function Changes Accompanying Changes in Composition of (100) Surfaces of $HfC_x$ and $TaC_x$", Surface Science Letters 239, 1990, pp. L517-L520.

Chang Seo Park, et al., "An Integratable Dual Metal Gate CMOS Process Using an Ultrathin Aluminum Nitride Buffer Layer", IEEE Electron Device Letters, vol. 24, No. 5, May 2003, pp. 298-300.

J. K. Schaeffer, et al., "Physical and Electrical Properties of Metal Gate Electrodes on $HfO_2$ Gate Dielectrics", J. Vac. Sci. Technol. B 21 (1), Jan./Feb. 2003, pp. 11-17.

You-Seok Suh, et al., "Electrical Characteristics of $TaSi_xN_y$ Gate Electrodes for Dual Gate Si-CMOS Devices", 2001 Symposium on VLSI Technology Digest of Technical Papers, 2001, pp. 1-2.

B. Govoreanu, et al., "Scaling Down the Interpoly Dielectric for Next Generation Flash Memory: Challenges and Opportunities", Solid-State Electronics 49, 2005, pp. 1841-1848.

Seiichi Mori, et al., "ONO Inter-Poly Dielectric Scaling for Nonvolatile Memory Applications", IEEE Transactions on Electron Devices, vol. 38. No. 2, Feb. 1991, pp. 386-391.

Seiichi Mori, et al., "Thickness Scaling Limitation Factors of ONO Interpoly Dielectric for Nonvolatile Memory Devices", IEEE Transactions on Electron Devices, vol. 43, No. 1, Jan. 1996, pp. 47-53.

Y. H. Kim, et al., "High Quality CVD TaN Gate Electrode for Sub-100nm MOS Devices", Int. Electron Devices Meet. 01. 667, (IEDM2001, 667) 2001, 4 pages.

E. A. Brandes, et al., "Smithells Metals Reference Book", edited, 1 page.

U.S. Appl. No. 12/560,035, filed Sep. 15, 2009, Yasuda.

* cited by examiner

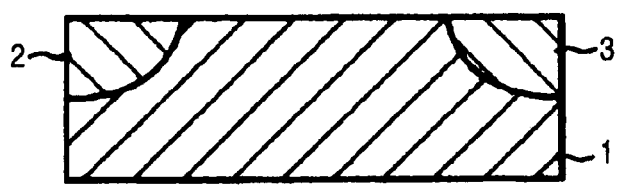
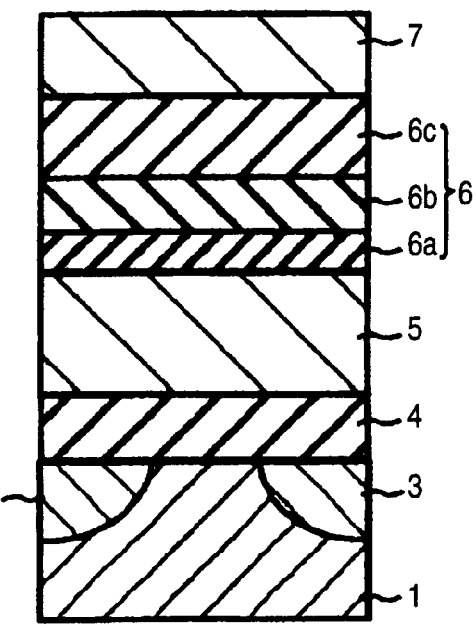
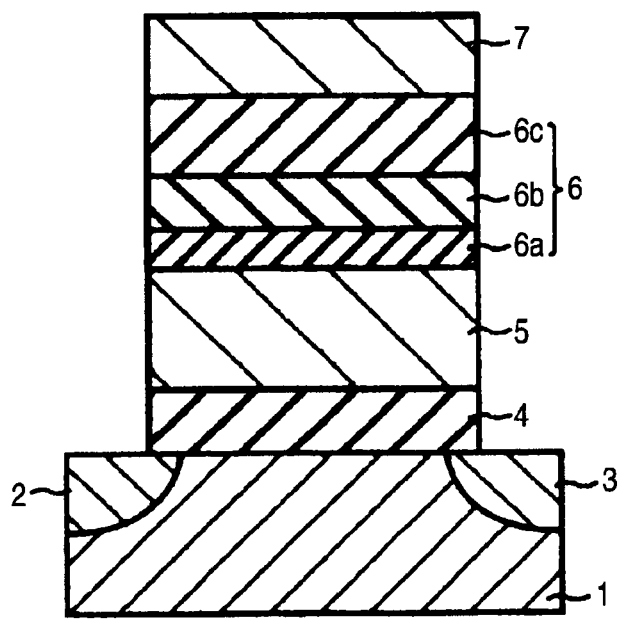

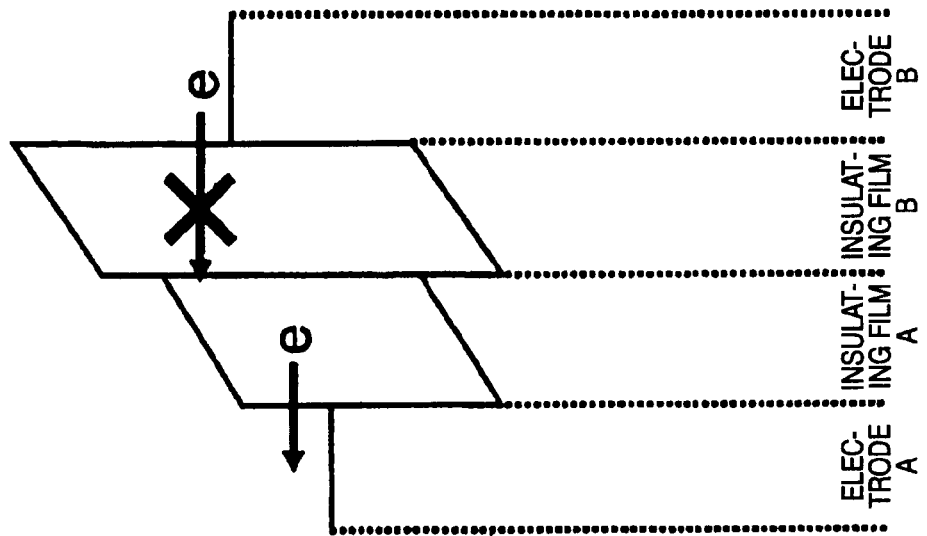
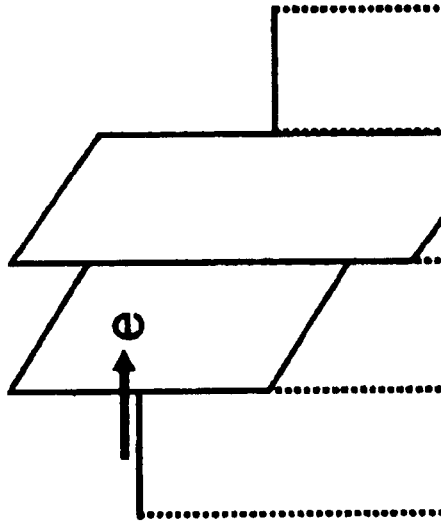
FIG. 4A POTENTIAL EQUAL STATE
FIG. 4B TRAP-BIAS APPLYING STATE
FIG. 4C DETRAP-BIAS APPLYING STATE

NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT

CROSS-REFERENCE TO RELATED APPLICATIONS

This application claims priority from Japanese Patent Application No. 2008-206291 filed on Aug. 8, 2008, the entire contents of which are incorporated herein by reference.

BACKGROUND OF THE INVENTION

1. Field of the Invention

An aspect of the present invention relates to a nonvolatile semiconductor memory element, nonvolatile semiconductor memory, and a method for operating the nonvolatile semiconductor memory element.

2. Description of the Related Art

A nonvolatile semiconductor memory element has a structure wherein a tunnel insulating film, a charge storage layer, an upper insulating layer and a control gate are deposited on a semiconductor substrate. The charge storage layer may be formed of a conductive charge storage layer or may be formed of a non-conductive charge storage layer. In the description to follow, the nonvolatile semiconductor memory element using the conductive charge storage layer will be discussed as the floating gate type and the nonvolatile semiconductor memory element using the non-conductive charge storage layer will be discussed as the floating trap type.

With miniaturization (finer design rules) of the nonvolatile semiconductor memory, it is necessary to make the upper insulating layer thinner. Problems introduced as the upper insulating layer becomes thinner will be discussed separately for the floating gate type and the floating trap type.

In the floating gate type, with the upper insulating layer made thinner, the leak current from the conductive charge storage layer at the writing operation is increased and it is made difficult to store a charge. On the other hand, in the floating trap type, with the upper insulating layer made thinner, at the erasing operation, electron injection from the control gate into the charge storage layer is increased and the erasing efficiency is degraded.

Thus, with the upper insulating layer made thinner, the leak current characteristic is increased and the write operation in the floating gate type and the erasing operation in the floating trap type are degraded. Thus, an upper insulating layer having a lower leak current characteristic than that of former structure is required. The leak current characteristic can be decreased by adopting a structure for trapping an electron in the upper insulating layer.

To adopt the structure for trapping an electron in the upper insulating layer, while decreasing the leak current, there is a problem in that the electron trapped at the write operation, the read operation, or the erasing operation is emitted during the data retaining time and causes threshold fluctuation of the nonvolatile semiconductor memory element. JP-2007-193862-A discloses an art of suppressing emission of the electron trapped in the upper insulating layer during the data retaining time. In JP-2007-193862-A, a detrap pulse is applied after data is written into a nonvolatile semiconductor memory element. The detrap pulse is applied, whereby the charge trapped in the upper insulating layer at the write operation can be pulled out, so that charge emission from the upper insulating layer to the charge storage layer at the data retaining time can be suppressed and threshold fluctuation of the nonvolatile semiconductor memory element can be suppressed. The detrap pulse is applied, whereby charge emission from the upper insulating layer to the charge storage layer at the data retaining time can be suppressed and threshold fluctuation of the nonvolatile semiconductor memory element can be suppressed.

In the art, the inventor of the invention focused attention on the fact that while the charge can be pulled out from the upper insulating layer to the charge storage layer at the detrap pulse, a charge from the control gate may be trapped in the upper insulating layer and consequently the charge trapped in the upper insulating layer cannot sufficiently be pulled out. Consequently, the inventor found that there is a possibility that threshold fluctuation of the nonvolatile semiconductor memory element caused by charge emission from the upper insulating layer to the charge storage layer at the data retaining time cannot sufficiently be suppressed.

SUMMARY OF THE INVENTION

According to an aspect of the present invention, there is provided a nonvolatile semiconductor memory element including: a semiconductor substrate including: a source region that is formed in the semiconductor substrate; a drain region that is formed in the semiconductor substrate; and a channel region that is sandwiched between the source region and the drain region; a lower insulating film that is formed on the channel region; a charge storage film that is formed on the lower insulating film and that stores data; an upper insulating film that is formed on the charge storage film; and a control gate that is formed on the upper insulating film, wherein the upper insulating film includes: a first insulting film; and a second insulating film that is laminated with the first insulating film, and wherein the first insulating film is formed to have a trap level density larger than that of the second insulating film.

BRIEF DESCRIPTION OF THE DRAWINGS

FIGS. 2A to 2C are step sectional views to show a manufacturing method of the nonvolatile semiconductor memory element according to the first embodiment.

FIGS. 4A to 4C are schematic drawings of a band diagram concerning an MIM capacitor in the second embodiment.

DETAILED DESCRIPTION OF THE INVENTION

Figure 1:
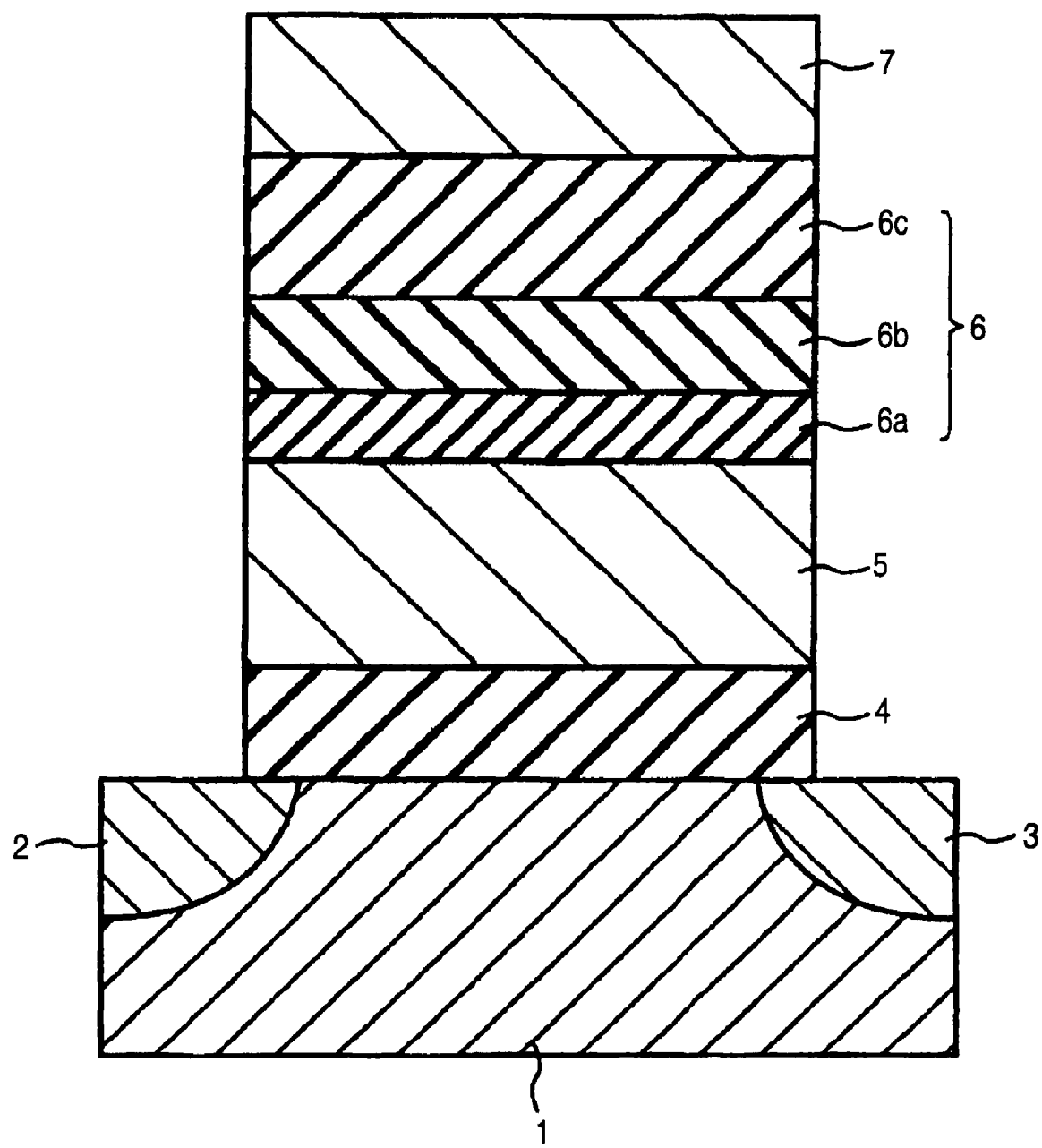
FIG. 1 is a sectional view to show the structure of a nonvolatile semiconductor memory element according to a first embodiment of the invention.

Referring now to the accompanying drawings, there are shown embodiments of the invention. In the accompanying drawings, identical or similar parts are denoted by the same or similar reference numeral. However, it is noted that the accompanying drawings are schematic and the relationship between each thickness and plan value, the thickness ratio between layers, and the like differ from those actually applied. Therefore, the specific thicknesses and values should be determined considering the description that follows. The accompanying drawings contain portions different in mutual value relationship, ratio, etc., of course.

In the embodiments of the invention, "first conduction type" and "second conduction type" are opposite conduction types to each other. If the first conduction type is n type, the second conduction type is p type; if the first conduction type is p type, the second conduction type is n type. In the description to follow, the first conduction type is p type and the second conduction type is n type; however, the first conduction type may be n type and the second conduction type may be p type.

First Embodiment

FIG. 1 is a sectional view to show a nonvolatile semiconductor memory element according to a first embodiment of the invention. The nonvolatile semiconductor memory element is an individual part of a nonvolatile semiconductor memory and has an independent proper function. The nonvolatile semiconductor memory contains a plurality of nonvolatile semiconductor memory elements.

The embodiment of the invention will be discussed with reference to FIG. 1.

The nonvolatile semiconductor memory element according to the first embodiment has a structure wherein a source region 2 and a drain region 3 of second conduction type, such as n$^+$ type, formed at a distance from each other are formed in a semiconductor substrate 1 of first conduction type, such as p$^-$ type. A region of the p$^-$-type semiconductor substrate 1 between the source region 2 and the drain region 3 becomes a channel region. The superscript − of the p$^-$ type represents that the p-type impurity concentration is low, and the superscript + of the n$^+$ type represents that the n-type impurity concentration is high. The source region 2 and the drain region 3 are formed by injecting phosphorus.

In the structure, a tunnel insulating film 4, a conductive charge storage layer 5, an upper insulating layer 6 and a control gate 7 are deposited on the channel region of the surface of the p$^-$-type semiconductor substrate 1. The tunnel insulating film 4, the conductive charge storage layer 5 and the control gate 7 have thicknesses of 5 to 10 nm, 5 to 100 nm and 5 to 100 nm respectively, for example. The upper insulating layer 6 has a three-layer structure of a transmitting layer 6a, a trapping layer 6b, and a blocking layer 6c wherein the transmitting layer 6a, the trapping layer 6b and the blocking layer 6c are deposited in order on the conductive charge storage layer 5. The transmitting layer 6a, the trapping layer 6b and the blocking layer 6c have thicknesses of 0.5 to 4 nm, 1 to 5 nm, and 4 to 20 nm respectively, for example.

The tunnel insulating film 4 is functioning as a lower insulating film; the upper insulating layer 6 is functioning as an upper insulating film; the trapping layer 6b is functioning as a first insulating film; the blocking layer 6c is functioning as a second insulating film; and the transmitting layer 6a is functioning as a third insulating film.

Material of the upper insulating layer 6, namely, the transmitting layer 6a, the trapping layer 6b and the blocking layer 6c will be discussed below: As the trapping layer 6b, a material having an electron trap level density larger than that of a material of the blocking layer 6c and the transmitting layer 6a is used.

Preferably, the blocking layer 6c uses a material to enable a film of a small trap level density to be formed. For example, the blocking layer 6c is formed containing an SiO$_2$ film, an Al$_2$O$_3$ film, an LaAlSiO film, or a film formed by replacing at least a part of the oxygen atoms of the SiO$_2$ film, the Al$_2$O$_3$ film, or the LaAlSiO film with nitrogen atoms. The blocking layer 6c may be formed by laminating at least two of the aforementioned films. An SiO$_2$ film, an SiON film, an SiN film, an Al$_2$O$_3$ film and an LaAlSiO film may be preferably used.

For example, the trapping layer 6b is formed of a material including the same constituent elements as the material of the blocking layer 6c, and the constituent-elements composition ratio of the trapping layer 6b is a largely different from the stoichiometric ratio as compared with that of the blocking layer 6c, thereby enhancing the electron trap level density of the trapping layer 6b as compared with that of the blocking layer 6c.

As another example of the trapping layer 6b, a film with a specific element added to the same material as the blocking layer 6c or a material of the same constituent elements, whose composition ratio is changed, as the blocking layer 6c may be used. Such material is used, whereby the electron trap level density of the trapping layer 6b can be made larger than that of the blocking layer 6c. As the elements to be added, one or more elements of B, C, N, F, Al, Si, P, S, Cl, Ga, As, Ti, Y, Zr, La, Pr, Nd, Sm, Gd, Dy, Hf, or Ta are used. Particularly, it is preferable to use a film acquired by adding Hf or Zr to the blocking layer 6c material. That is, if the blocking layer 6c is SiO$_2$, preferably HfSiO or ZrSiO is used as the trapping layer 6b. If the blocking layer 6c is Al$_2$O$_3$, preferably HfAlO or ZrAlO is used as the trapping layer 6b.

As another example of the trapping layer 6b, a film containing oxide, nitride, or oxynitride of Ti, Y, Zr, La, Pr, Nd, Sm, Gd, Dy, Hf, or Ta is used. Such material is used, whereby the electron trap level density of the trapping layer 6b can be made larger than that of the blocking layer 6c. Particularly, preferably a film containing oxide, nitride, or oxynitride of any of Ti, Y, Zr, or Hf is used as the trapping layer 6b.

As another example of the trapping layer 6b, SiN is also used.

Materials of the trapping layer 6b and the blocking layer 6c for forming an electron trap on the interface between the trapping layer 6b and the blocking layer 6c if the electron trap level density of the trapping layer 6b is insufficient can be used. The electron trap occurring on the interface traps an electron instead of trapping an electron by the trapping layer 6b. For example, materials of entirely different constituent elements between the blocking layer 6c and the trapping layer 6b are used as the blocking layer 6c and the trapping layer 6b, whereby an electron trap is formed on the interface between the trapping layer 6b and the blocking layer 6c. For example, SiN can be used as the trapping layer 6b and Al$_2$O$_3$ can be used as the blocking layer 6c.

Preferably, as the transmitting layer 6a, a film having a small electron trap level density is formed. For example, the transmitting layer 6a is formed of an SiO$_2$ film, an Al$_2$O$_3$ film, an LaAlSiO film, or a film formed by replacing at least a part of the oxygen atoms of the SiO₂ film, the Al₂O₃ film, or the LaAlSiO film with nitrogen atoms. The transmitting layer 6a may be formed by laminating at least two of the aforementioned films. An SiO₂ film may be preferably used as the transmitting layer 6a. As the transmitting layer, a film made of the same material as the blocking layer 6c may be preferably used.

The preferred materials of the transmitting layer 6a, the trapping layer 6b and the blocking layer 6c have been described. The preferred material combinations of the transmitting layer 6a, the trapping layer 6b and the blocking layer 6c are shown below in the form of transmitting layer 6a/trapping layer 6b/blocking layer 6c: For example, SiO₂/SiN/Al₂O₃, SiO₂/HfAlO/Al₂O₃, SiO₂/ZrAlO/Al₂O₃, SiO₂/TiAlO/Al₂O₃, SiO₂/HfSiO/Al₂O₃ and SiO₂/ZrSiO/Al₂O₃. As for these combinations, SiO₂ may be replaced with SiON, Al₂O₃ may be replaced with SiO₂, and SiO₂ may be replaced with Al₂O₃.

Preferably, the transmitting layer 6a has a large leak current characteristic relative to the blocking layer 6c. To make the leak current characteristic of the transmitting layer 6a larger than that of the blocking layer 6c, the film thickness of the transmitting layer 6a is thinned as compared with the blocking layer 6c. Particularly, to make the leak current characteristic of the transmitting layer 6a large relative to the blocking layer 6c, preferably the film thickness of the transmitting layer 6a is thinner than that of the blocking layer 6c. The advantage provided by increasing the leak current characteristic of the transmitting layer 6a to be larger than that of the blocking layer 6c will be discussed below: As an example wherein the leak current characteristic of the transmitting layer 6a is larger than that of the blocking layer 6c, the case where the transmitting layer 6a uses the same material as the blocking layer 6c and has a thin film thickness as compared with the blocking layer 6c will be discussed. At the writing operation, the leak current characteristic of the transmitting layer 6a is larger than that of the blocking layer 6c and thus the electron injection amount into the trapping layer 6b exceeds the emission amount and an electron can be trapped effectively. On the other hand, at the detrap pulse of applying a voltage of a different polarity from that at the writing operation, the electron trapped in the trapping layer 6b is emitted to the charge storage layer 5 effectively. That is, since the leak current characteristic of the transmitting layer 6a is larger than that of the blocking layer 6c, an electron is emitted effectively from the trapping layer 6b to the charge storage layer 5; while, electron injection from the control gate 7 to the trapping layer 6b is blocked by the blocking layer 6c. As described above, the upper insulating layer 6 adopts the three-layer structure of the transmitting layer 6a, the trapping layer 6b and the blocking layer 6c, and the leak current characteristic of the transmitting layer 6a is made larger than that of the blocking layer 6c, whereby effective detrapping is performed for the charge storage layer 5 from the upper insulating layer 6.

For an NAND-type cell array application, as for the upper insulating layer 6, preferably the following expression is satisfied for suppressing charge trapping in the trapping layer 6b at the reading operation and suppressing charge detrapping from the trapping layer 6b at the standby time:

$$0<(EOT_1+EOT_2)/(EOT_1+EOT_2+EOT_3)<(\Phi-\phi)/V_{pass} \quad \text{(Expression 1)}$$

where $EOT_1$, $EOT_2$ and $EOT_3$ are equivalent oxide thicknesses of the transmitting layer 6a, the trapping layer 6b and the blocking layer 6c respectively. Letting $\in_{Si}$ be dielectric constant of Si and film thickness and dielectric constant of each film be $T_n$ and $\in_n$, equivalent oxide thickness $EOT_n$ is given according to the following expression:

$$EOT_n = T_n \times \in_{Si}/\in_n \quad \text{(Expression 2)}$$

For a laminated film of two or more layers, the equivalent oxide thickness $EOT_n$ is given according to the following expression:

$$EOT_n = \Sigma_i T_{ni} \times \in_{Si}/\in_{ni} \quad \text{(Expression 3)}$$

$\Phi$ is work function or electron affinity of the conductive charge storage layer 5, $\phi$ is trap level of the trapping layer 6b with the vacuum level as the reference, and $V_{pass}$ is the largest voltage given to an unselected cell on the same bit line as a read cell at the reading operation of NAND-type flash memory.

Next, the reason why preferably the "Expression 1" described above is satisfied as for the upper insulating layer 6 to suppress charge trapping in the trapping layer 6b at the reading operation and suppress charge detrapping from the trapping layer 6b at the standby time is as follows:

To suppress an electron trapping in the trapping layer 6b at the reading operation, preferably the Fermi level of the conductive charge storage layer 5 at the reading operation is positioned on the lower energy side than the trap level of the trapping layer 6b. Therefore, to suppress an electron trapping in the trapping layer 6b at the reading operation, letting the work function or electron affinity of the conductive charge storage layer 5 be $\Phi$, the trap level of the trapping layer 6b with the vacuum level as the reference be $\phi$, and the trap level shift amount in the trapping layer 6b caused by the reading operation voltage applied thereto and the charge trapped in the charge storage layer be $V_r$, preferably the following expression is satisfied:

$$\Phi - (\phi + V_r) > 0 \quad \text{(Expression 4)}$$

Letting the voltage applied to the upper insulating layer 6 be $V_{IPD}$, the trap level shift amount $V_r$ in the trapping layer 6b caused by the reading operation voltage applied thereto takes the maximum value given from the following "Expression 5" on the interface between the trapping layer 6b and the blocking layer 6c:

$$V_r = (EOT_1 + EOT_2)/(EOT_1 + EOT_2 + EOT_3) \times V_{IPD} \quad \text{(Expression 5)}$$

"Expression 5" is assigned to "Expression 4" to obtain $$\Phi - (\phi + (EOT_1+EOT_2)/(EOT_1+EOT_2+EOT_3) \times V_{IPD}) > 0 \quad \text{(Expression 6)}$$

It is desirable to form the upper insulating layer 6 so that "Expression 6" is satisfied even if $V_{IPD}$ becomes the maximum value.

To form an NAND-type cell array, the maximum value of $V_{IPD}$ is derived as follows: At the NAND-type flash memory reading operation, it is necessary to turn on all cells on the same bit line as the read cell. Thus, the largest voltage $V_{pass}$ is applied to an unselected cell on the same bit line as the read cell. Since $V_{pass}$ is distributed to the tunnel insulating film 4 and the upper insulating layer 6, the maximum value of $V_{IPD}$ does not exceed $V_{pass}$. Therefore, the maximum value of $V_{IPD}$ is $V_{pass}$.

In "Expression 6", setting $V_{IPD} = V_{pass}$, $$\Phi - (\phi + (EOT_1+EOT_2)/(EOT_1+EOT_2+EOT_3) \times V_{pass}) > 0 \quad \text{(Expression 7)}$$

is obtained. $V_{pass}$ is more than 0 V and is equal to or less than 10 V.

"Expression 7" is modified to $$(EOT_1+EOT_2)/(EOT_1+EOT_2+EOT_3) < (\Phi-\phi)/V_{pass} \quad \text{(Expression 8)}$$

Since $EOT_n$ (n=1 to 3)>0, $$0 < (EOT_1+EOT_2)/(EOT_1+EOT_2+EOT_3) < (\Phi-\phi)/V_{pass} \quad \text{(Expression 9)}$$

Thus, it is understood that it is preferable to satisfy the relation in "Expression 1" to suppress charge trapping in the trapping layer 6b at the reading operation and suppress charge detrapping from the trapping layer 6b at the standby time.

Table 1 lists electron trap level energy φ and dielectric constants about a plurality of materials used for the trapping layer 6b.

TABLE 1

| Composition | Trap depth (eV)*1 | Trap level φ(eV)*2 | Relative Permittivity | Source | Recital |
|---|---|---|---|---|---|
| HfO2 | 0.3 | 2.8 | 25 | IEDM, 2002, pp. 731-734 | |
| | 1.3 | 3.8 | | | |
| | 0.5 | 3.0 | | Appl. Phys. Lett. 80, No. 11, 18 Mar. 2002 | |
| | 0.7 | 3.2 | | | |
| | 0.8 | 3.3 | | | |
| HfAlO | 1.2 | 3.2 | 18 | IEEE Electron Device Letters, Vol. 29, No. 2, February 2008 | Hf/Al = 1 |
| | 2.0 | 4.0 | | | |
| HfSiON | 0.9 | 3.3 | 14 | Jpn. J. Appl. Phys., Vol. 45, No. 4B (2006) | Hf/Si = 1, N15% |
| ZrO2 | 0.8 | 2.8 | 25 | J. Appl. Phys., Vol. 87, No 12, 15 Jun. 2000 | |
| Si3N4 | 1.1 | 2.7 | 7 | Solid State Electronics 44 (2000) 949-958 | |
| | 1.5 | 3.1 | | Appl. Phys. Lett. Vol. 32, No. 5, 1 Mar. 1978 | |
| | 0.7 | 2.3 | | J. Appl. Phys., Vol. 44, No 10, October 1973 | |

*1Energy level of electron trap with energy of conduction band lower end of insulating film as reference
*2Energy level of electron trap with vacuum level as reference In Table 1, "Trap depth" denotes the energy level of electron trap with the energy of the conduction band lower end of the insulating film as the reference, and "Trap level" denotes the energy level of electron trap with the vacuum level as the reference.

For the control gate 7 or the conductive charge storage layer 5, it is desirable to use a material stable in a thermal step of impurity activation. In addition to polysilicon, as material satisfying the above-mentioned condition, nitride or carbide of Ti, Ta, or W and a material formed by adding Al or Si thereto is used. Table 2 lists representative materials of the control gate 7 or the conductive charge storage layer 5 and work functions.

TABLE 2

| Material | Work function φ (eV) | Source | Recital |
|---|---|---|---|
| TiC | 3.35 | Smithells Metal Reference Book. E. A. Brandes et al. edited | |
| | 3.80 | J. Less-Common Metal 82. (1981) 69. | TiC(100) |
| TiN | 2.91 | Appl. Surf. Sci 146. (1999) 177. | |
| | 4.80 | VLSI-sympo. 2002. 24. | |
| TiAlN | 5.00-5.20 | IEDM2001, 671. | TiAlNy y~1 |
| | 4.36-4.50 | | TiAlNy y < 1 |
| TaC | 3.14 | Smithells Metal Reference Book. E. A. Brandes et al. edited | |
| | 4.38 | Surf. Sci. 239, (1990) L517. | Ta/C = 1 |
| | 4.73 | | Ta/C = 2 |
| TaN | 4.00 | Appl. Surf. Sci 146. (1999) 177. | |
| | 5.00 | Int. Electron Devices Meet. 01. 667 (2001). (IEDM2001, 667.) | Ta/N = 1 |
| TaAlN | 4.90 | IEEE-EDL 24. (2003) 298. | |
| TaSiN | 4.40 | J. Vac. Sci. Technol. B21(1) 11. | N26% |
| | 4.27 | VLSI-sympo. 2001. 47. | |
| WN | 4.35 | J. Vac. Sci. Technol. B21(1) 11. | W/N = 1.5 |

"Work function" denotes the Fermi energy of metal with the vacuum level as the reference. The work functions of the materials can be modulated to any desired values according to the composition, film formation condition, thermal step after film formation, orientation of crystal, etc. To use a semiconductor of polysilicon, etc., doped with impurities at a high concentration as the control gate or the conductive charge storage layer, electron affinity corresponds to the work function; for example, it is known that the electron affinity of silicon crystal is 4.05 eV. If polysilicon is used as the conductive charge storage layer 5, "electron affinity" corresponds to the "work function", and the "Expression 1" is adaptable.

Next, a manufacturing process of the nonvolatile semiconductor memory element according to the embodiment will be discussed with reference to FIGS. 2A to 2C. FIGS. 2A to 2C are step sectional views to show the manufacturing process of the nonvolatile semiconductor memory element.

First, as shown in FIG. 2A, an insulating film is formed on entire top surface of a p⁻-type semiconductor substrate 1, such as a p⁻-type Si substrate. As the insulating film, a silicon oxide film is formed by thermal oxidation, for example. Next, the silicon oxide film is etched, thereby forming a first insulating film pattern exposing both end parts of the p⁻-type semiconductor substrate 1 where a source region 2 and a drain region 3 are to be formed. Next, for example, phosphorus ion implementation is executed onto the surface of the p⁻-type semiconductor substrate 1 with the first insulating film pattern as a mask, thereby forming the n⁺-type source region 2 and drain region 3. Next, etching is performed, thereby removing the first insulating film pattern. Consequently, the n⁺-type source region 2 and drain region 3 are formed in the surface of the p⁻-type semiconductor substrate 1.

Next, as shown in FIG. 2B, an insulating film which will become a tunnel insulating film 4 is formed on entire top surface of the p⁻-type semiconductor substrate 1. As the insulating film, a silicon oxide film is formed by thermal oxidation, for example. The silicon oxide film is formed in a film thickness of 5 to 10 nm, for example. Next, for example, polysilicon is deposited on the silicon oxide film by a CVD method to form a polysilicon film which will become a conductive charge storage layer 5. The polysilicon film is formed in a film thickness of 5 to 100 nm, for example. Next, for example, $SiO_2$ is deposited on the polysilicon film by the CVD method to form an $SiO_2$ film which will become a transmitting layer 6a. Next, for example, SiN is deposited on the transmitting layer 6a by the CVD method to form an SiN film which will become a trapping layer 6b. Next, for example, $SiO_2$ is deposited on the trapping layer 6b by the CVD method to form an $SiO_2$ film which will become a blocking layer 6c.

The trap level density can be increased or decreased according to the film formation condition. By the impurities of C, Cl, etc. are contained when the trapping layer 6b is formed by the CVD method, the trap level is provided in the trapping layer 6b. Therefore, for example, by forming the trapping layer 6b while lowering the film formation temperature, the trap level density can be increased. The transmitting layer 6a and the trapping layer 6b are formed by the CVD method using the same material, and as the film formation condition, the temperature at the film forming time of the trapping layer 6b is set lower than that at the film forming time of the transmitting layer 6a, thereby forming the transmitting layer 6a and the trapping layer 6b having a trap level density larger than that of the transmitting layer 6a. By forming the transmitting layer 6a and the trapping layer 6b in such condition, the trap level density of the trapping layer 6b can be made larger than that of the transmitting layer 6a. Likewise, the blocking layer 6c and the trapping layer 6b can be formed by the CVD method using the same material and adapting the film formation condition in which the temperature at the film forming time of the trapping layer 6b is set to lower than that of the temperature at the film forming time of the blocking layer 6c.

Next, for example, polysilicon is deposited on the blocking layer 6c by the CVD method to form a polysilicon film which will become a control gate 7. The polysilicon film is formed in a film thickness of 5 to 100 nm, for example.

Next, as shown in FIG. 2C, lithography is executed for the laminated structure made up of the silicon oxide film, the polysilicon film, the $SiO_2$ film, the SiN film, the $SiO_2$ film and the polysilicon film, thereby partially exposing the source region 2 and the drain region 3. Consequently, the laminated structure is formed wherein the tunnel insulating film 4 formed of the silicon oxide film, the conductive charge storage layer 5 formed of the polysilicon film, the transmitting layer 6a formed of the $SiO_2$ film, the trapping layer 6b formed of the SiN film, the blocking layer 6c formed of the $SiO_2$ film and the control gate 7 formed of the polysilicon film are deposited in order. The described manufacturing process is executed, thereby forming the nonvolatile semiconductor memory element according to the first embodiment shown in FIG. 1.

Next, a writing operation in the nonvolatile semiconductor memory element according to the first embodiment will be discussed. At the writing operation, first, a positive voltage is applied to the control gate 7 and an electron is injected into the conductive charge storage layer 5 through the tunnel insulating film 4 from the semiconductor substrate 1. At this time, as the voltage applied to the control gate 7, the equivalent oxide field in the upper insulating layer 6 exceeds 0 MV/cm and is equal to or less than 30 MV/cm and the time is in the range of 1 ns to 10 ms. More preferably, the equivalent oxide field is in the range of 10 MV/cm to 25 MV/cm and the time is in the range of 1 ns to 0.1 ms. At this time, an electron is injected into the upper insulating layer 6 from the conductive charge storage layer 5 and is trapped. The upper insulating layer 6 traps the electron, so that electron leak from the conductive charge storage layer 5 to the control gate 7 is suppressed. This voltage applied at the writing operation is referred to as a writing trap pulse. Next, a first detrap pulse different in polarity from the above-mentioned voltage is applied. At this time, the first detrap pulse is characterized by the fact that at least either the absolute voltage value or the time length of the first detrap pulse is smaller than the operating voltage at the writing operation. As the first detrap pulse, more preferably the equivalent oxide field in the upper insulating layer 6 exceeds 0 MV/cm and is equal to or less than 10 MV/cm and the time is in the range of 1 ns to 0.1 ms. The first detrap pulse is applied, whereby the electron trapped in the upper insulating layer 6 at the writing operation is emitted to the conductive charge storage layer 5. As described above, in the embodiment, the upper insulating layer 6 adopts the laminated structure of the transmitting layer 6a, the trapping layer 6b and the blocking layer 6c, the trap level density of each of the transmitting layer 6a and the blocking layer 6c is made smaller than that of the trapping layer 6b, and the leak current characteristic of the transmitting layer 6a is made higher than that of the blocking layer 6c, so that charge can be effectively emitted to the charge storage layer 5 by applying the first detrap pulse.

When the first detrap pulse is applied, excessive holes may be trapped in the trapping layer 6b. When excessive holes are trapped in the trapping layer 6b, if the excessively trapped holes are emitted at the standby time, threshold fluctuation is caused to occur and reliability is degraded. Thus, a second detrap pulse of the same polarity as the writing trap pulse is applied as required after the first detrap pulse is applied. The second detrap pulse is applied, whereby electrons is injected into the upper insulating layer 6 to cancel out the excessive holes. At this time, the electron amount injected into the upper insulating layer 6 needs to be small as compared with the writing trap pulse. Therefore, at least either the absolute voltage value or the time length of the second detrap pulse needs to be smaller than the writing trap pulse. As the second detrap pulse, more preferably the equivalent oxide field applied to the upper insulating layer 6 exceeds 0 MV/cm and is equal to or less than 10 MV/cm and the time is in the range of 1 ns to 0.1 ms.

In the nonvolatile semiconductor memory element according to the embodiment, charge emission from the upper insulating layer 6 at the data retaining time is prevented, the threshold fluctuation during the data retaining time is suppressed, and the reliability is enhanced. Particularly, in the embodiment, the upper insulating layer 6 adopts the laminated structure of the transmitting layer 6a, the trapping layer 6b and the blocking layer 6c, the leak current characteristic of the transmitting layer 6a is made larger than that of the blocking layer 6c, and the trap level density of each of the transmitting layer 6a and the blocking layer 6c is made smaller than that of the trapping layer 6b, so that charge can be effectively emitted to the charge storage layer 5 by applying the first detrap pulse.

According to the embodiment, an electron is trapped in the trapping layer 6b at the writing operation, whereby the leak current from the conductive charge storage layer 5 to the control gate 7 at the writing operation is suppressed and the threshold difference at the writing operation is increased. Particularly, in the upper insulating layer 6 according to the embodiment, the film thickness of the transmitting layer 6a is thinner than that of the blocking layer 6c, and thus the leak current characteristic of the transmitting layer 6a is larger than that of the blocking layer 6c. Therefore, at the writing operation, the transmitting layer 6a allows an electric current to well flow as compared with the blocking layer 6c, so that more electrons are trapped in the trapping layer 6b having a higher trap level density.

According to the embodiment, the electron trapped in the trapping layer 6b at the writing operation is detrapped to the conductive charge storage layer 5 by applying a detrap pulse, whereby the stored charge amount of the conductive charge storage layer 5 is increased, large threshold difference relative to the applied voltage of the writing trap pulse is obtained, and the operating voltage is decreased.

In the embodiment, after a first detrap pulse is applied, a second detrap pulse of a different polarity from the first detrap pulse is applied, whereby the hole injected into the trapping layer 6b at the first detrap pulse is canceled out. According to the operation, hole emission from the trapping layer 6b at the data retaining time is prevented and the threshold fluctuation during the data retaining time is suppressed.

Second Embodiment

Figure 3:
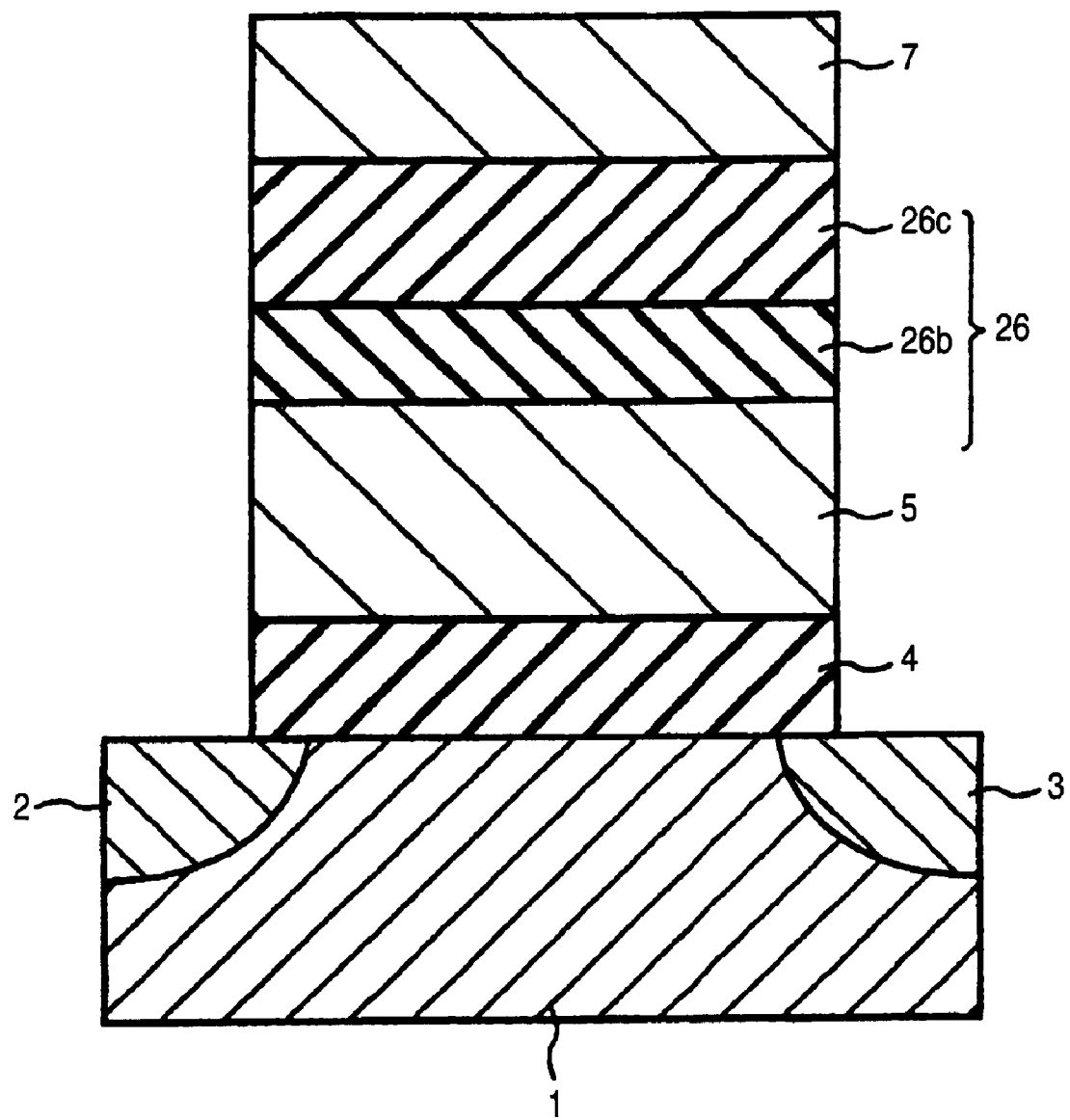
FIG. 3 is a sectional view to show the structure of a nonvolatile semiconductor memory element according to a second embodiment of the invention.

FIG. 3 is a sectional view to show a nonvolatile semiconductor memory element according to a second embodiment of the invention.

The nonvolatile semiconductor memory element according to the second embodiment differs in that an upper insulating layer 26 has a two-layer structure of a trapping layer 26b and a blocking layer 26c from the nonvolatile semiconductor memory element according to the first embodiment wherein the upper insulating layer 6 has the three-layer structure of the transmitting layer 6a, the trapping layer 6b and the blocking layer 6c.

That is, the nonvolatile semiconductor memory element according to the second embodiment has a structure wherein a source region 2 and a drain region 3 of second conduction type, such as n$^+$ type, formed at a distance from each other are formed in a semiconductor substrate 1 of first conduction type, such as p$^-$ type. In the structure, a tunnel insulating film 4, a conductive charge storage layer 5, the above-mentioned upper insulating layer 26 and a control gate 7 are deposited on a channel region of the surface of the p$^-$-type semiconductor substrate 1. The tunnel insulating film 4, the conductive charge storage layer 5 and the control gate 7 have thicknesses of 5 to 10 nm, 5 to 100 nm and 5 to 100 nm respectively, for example. The upper insulating layer 26 has the two-layer structure of the trapping layer 26b and the blocking layer 26c wherein the trapping layer 26b and the blocking layer 26c are deposited in order on the conductive charge storage layer 5. The trapping layer 26b and the blocking layer 26c have thicknesses of 1 to 5 nm and 4 to 20 nm respectively, for example.

Material of the upper insulating layer 26, namely, the trapping layer 26b and the blocking layer 26c will be discussed below:

As the material of the trapping layer 26b, material having a large electron trap level density as compared with that of the blocking layer 26c is used.

The same material as shown in the first embodiment can be used as the material of the trapping layer 26b and the blocking layer 26c. The trapping layer 26b uses material having a large electron trap level density as compared with the blocking layer 26c.

The preferred material combinations of the trapping layer 26b and the blocking layer 26c are shown below as in the form of trapping layer 26b/blocking layer 26c: For example, SiN/Al$_2$O$_3$, HfAlO/Al$_2$O$_3$, ZrAlO/Al$_2$O$_3$, TiAlO/Al$_2$O$_3$, HfSiO/Al$_2$O$_3$ and ZrSiO/Al$_2$O$_3$. As for these combinations, SiO$_2$ may be changed to SiON, Al$_2$O$_3$ may be changed to SiO$_2$, and SiO$_2$ may be changed to Al$_2$O$_3$.

To form an NAND-type cell array, as for the upper insulating layer 26, preferably the following expression is satisfied for suppressing charge trapping in the trapping layer 26b at the reading operation and suppressing charge detrapping from the trapping layer 26b at the standby time. The following expression is derived by assigning EOT$_1$=0 in "Expression 1" in the first embodiment:

$$0<(EOT_2)/(EOT_2+EOT_3)<(\Phi-\phi)/V_{pass} \quad \text{(Expression 10)}$$

As material of the control gate 7 and the conductive charge storage layer 5, similar material to that in the first embodiment is used.

A manufacturing process of the nonvolatile semiconductor memory element according to the second embodiment differs from the first embodiment in that the trapping layer 26b is formed on a polysilicon film of the conductive charge storage layer 5 and the transmitting layer 6a is not formed.

Next, a writing operation in the nonvolatile semiconductor memory element according to the second embodiment and a detrapping operation for detrapping an electron from the upper insulating layer 26 will be discussed. The writing operation is similar to those of the first embodiment.

According to the nonvolatile semiconductor memory element according to the embodiment, charge emission through the upper insulating layer 26 at the data retaining time is suppressed, the threshold fluctuation during the data retaining time is suppressed, and the reliability is enhanced. Particularly, in the embodiment, the upper insulating layer 26 adopts the two-layer structure made up of the trapping layer 26b on the conducive charge storage layer 5 side and the blocking layer 26c having the small trap level density as compared with that of the trapping layer 26b on the control gate 7 side. Consequently, electrons is effectively detrapped from the upper insulating layer 26 by applying the first detrap pulse after the writing operation.

According to the embodiment, as in the first embodiment, an electron is trapped in the trapping layer 26b at the writing operation, whereby the leak current from the conductive charge storage layer 5 to the control gate 7 at the writing operation is suppressed and the threshold difference at the writing operation is increased.

According to the second embodiment, as in the first embodiment, the electron trapped in the trapping layer 6b at the writing operation is detrapped to the conductive charge storage layer 5 by applying a detrap pulse, whereby the stored charge amount of the conductive charge storage layer 5 is increased, large threshold difference relative to the applied voltage of the writing trap pulse is obtained, and the operating voltage is decreased.

According to the second embodiment, as in the first embodiment, after a first detrap pulse is applied, a second detrap pulse of a different polarity from the first detrap pulse is applied, whereby the hole injected into the trapping layer 26b at the first detrap pulse is canceled out. According to the operation, hole emission from the trapping layer 26b at the data retaining time is prevented and the threshold fluctuation during the data retaining time is suppressed.

The reason why the electron is effectively detrapped by applying the first detrap pulse by adopting the two-layer structure of the upper insulating layer 26 made up of the trapping layer 26b on the conductive charge storage layer 5 side and the blocking layer 26c having the small trap level density as compared with that of the trapping layer 26b on the control gate 7 side is as follows:

FIGS. 4A to 4C are schematic drawings of a band diagram concerning an MIM capacitor provided by depositing an electrode A, an insulating film, and an electrode B. The insulating film of the MIM capacitor is made up of two layers of an insulating film A on the electrode A side and an insulating film B on the electrode B side, and the trap level density of the insulating film A is larger than that of the insulating film B. In the nonvolatile semiconductor memory element according to the embodiment and the MIM capacitor in FIGS. 4A to 4C, the electrode A corresponds to the conductive charge storage layer 5, the insulating film A corresponds to the trapping layer 26b, the insulating film B corresponds to the blocking layer 26c, and the electrode B corresponds to the control gate 7. FIG. 4A shows a state in which a voltage is applied to neither the electrode A nor the electrode B. In FIGS. 4A to 4C, the work functions of the electrodes A and B are the same, but the types and the work functions of the electrodes need not be the same. Band gaps and film thicknesses are also schematic and the relationship in FIGS. 4A to 4C need not be satisfied. Electron trap in the film modulates the potential of the insulating film, but is not illustrated in FIGS. 4A to 4C.

As for the MIM capacitor, when a positive voltage is applied to the electrode B, an electron is trapped in the insulating film A from the electrode A as shown in FIG. 4B, because the electron trap level density of the insulating film A is large. At this time, the electron amount trapped in the insulating film B is small as compared with the electron amount trapped in the insulating film A as it is negligible. Next, when a negative voltage is applied to the electrode B, the electron trapped in the insulating film A is detrapped to the electrode A as shown in FIG. 4C. Since the insulating film B exists, electron injection into the insulating film A from the electrode B is suppressed. Since the electron trap level density of the insulating film B is small, electron trap of the insulating film B is small. Consequently, when a negative bias is applied to the electrode B, the electron trapped in the insulating film A is detrapped efficiently. By forming the insulating films different in trap level density, the electron trapped in the insulating film A is effectively detrapped by applying a detrap pulse.

From the description given above, it is seen that the electron trapped in the upper insulating layer 26 at the writing operation is effectively detrapped by applying the first detrap pulse by adopting the two-layer structure made up of the trapping layer 26b on the conductive charge storage layer 5 side and the blocking layer 26c having the small electron trap level density as compared with that of the trapping layer 26b on the control gate 7 side, as the upper insulating layer 26.

Third Embodiment

Figure 5:
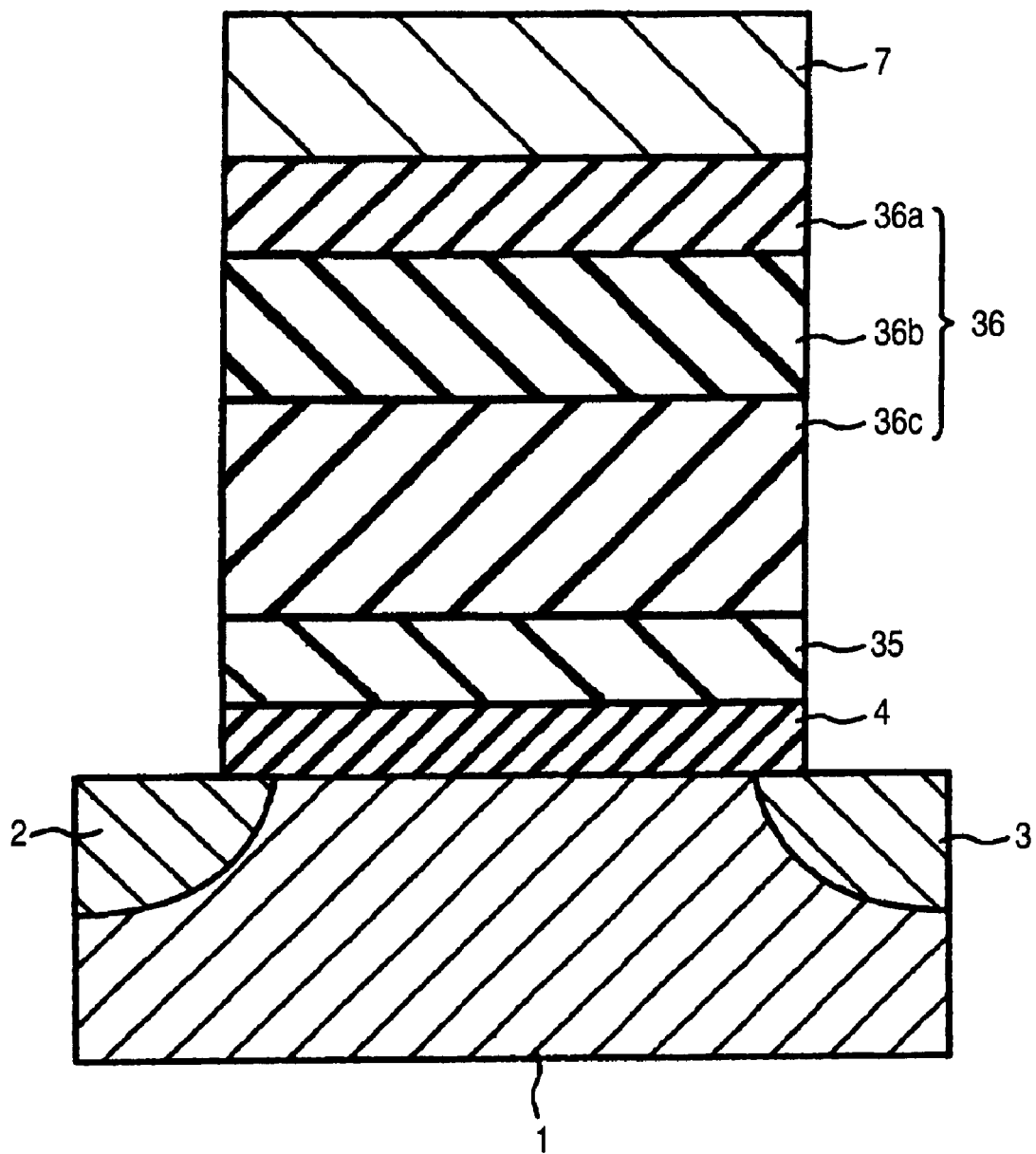
FIG. 5 is a sectional view to show the structure of a nonvolatile semiconductor memory element according to a third embodiment of the invention.

FIG. 5 is a sectional view to show a nonvolatile semiconductor memory element according to a third embodiment of the invention.

The third embodiment of the invention will be discussed below with reference to the accompanying drawings:

The nonvolatile semiconductor memory element according to the third embodiment has a structure wherein a source region 2 and a drain region 3 of second conduction type, such as n+ type, formed at a distance from each other are formed in a semiconductor substrate 1 of first conduction type, such as p− type. A region of the p−-type semiconductor substrate 1 between the source region 2 and the drain region 3 becomes a channel region.

In the structure, a tunnel insulating film 4, a non-conductive charge storage layer 35, an upper insulating layer 36 and a control gate 7 are deposited on the p−-type semiconductor substrate 1. The tunnel insulating film 4, the non-conductive charge storage layer 35 and the control gate 7 have thicknesses of 2 to 10 nm, 2 to 20 nm and 5 to 100 nm respectively, for example. The upper insulating layer 36 has a three-layer structure of a blocking layer 36c, a trapping layer 36b, and a transmitting layer 36a, wherein the blocking layer 36c, the trapping layer 36b and the transmitting layer 36a are deposited in order on the non-conductive charge storage layer 35. The blocking layer 36c, the trapping layer 36b and the transmitting layer 36a have thicknesses of 4 to 20 nm, 1 to 5 nm and 0.5 to 4 nm respectively, for example.

Material of the upper insulating layer 36, namely, the blocking layer 36c, the trapping layer 36b and the transmitting layer 36a will be discussed below:

As the material of the blocking layer 36c, the trapping layer 36b and the transmitting layer 36a, the same material as the material shown in the first embodiment can be used.

Next, preferred material combinations of the blocking layer 36c, the trapping layer 36b and the transmitting layer 36a will be discussed.

The preferred material combinations of the blocking layer 36c, the trapping layer 36b and the transmitting layer 36a are shown below in the form of blocking layer 36c/trapping layer 36b/transmitting layer 36a: For example, $Al_2O_3/SiN/SiO_2$, $Al_2O_3/HfAlO/SiO_2$, $Al_2O_3/ZrAlO/SiO_2$, $Al_2O_3/TiAlO/SiO_2$, $Al_2O_3/HfSiO/SiO_2$ and $Al_2O_3/ZrSiO/SiO_2$. As for these combinations, $SiO_2$ may be changed to SiON, $Al_2O_3$ may be changed to $SiO_2$, and $SiO_2$ may be changed to $Al_2O_3$.

Preferably, the transmitting layer 36a has a large leak current characteristic relative to the blocking layer 36c. To make the leak current characteristic of the transmitting layer 36a larger than that of the blocking layer 36c, the film thickness of the transmitting layer 36a is thinned, a material having a small dielectric constant is used, or a material having a small film thickness and a small dielectric constant is used as compared with the blocking layer 36c. Particularly, to make the leak current characteristic of the transmitting layer 36a larger than that of the blocking layer 36c, preferably the film thickness of the transmitting layer 36a is formed smaller than that of the blocking layer 36c.

As for the upper insulating layer 36, preferably the following expression is satisfied for suppressing charge trapping in the trapping layer 36b during standby time and effectively trapping an electron at the erasing operation:

$$0 < \Phi - \phi \leq (EOT_1 + EOT_2)/(EOT_{total}) \times V_{erase}$$ (Expression 11)

where $EOT_1$ and $EOT_2$ are equivalent oxide thicknesses of the transmitting layer 36a and the trapping layer 36b respectively. $EOT_{total}$ is the sum total of the equivalent oxide thicknesses of the tunnel insulating film 4, the non-conductive charge storage layer 35 and the upper insulating layer 36. $V_{erase}$ is the electric potential difference between the semiconductor substrate 1 and the control gate 7 at the erasing operation. $\Phi$ is work function of the control gate 7 and $\phi$ is trap level of the trapping layer 36b with the vacuum level as the reference.

Next, the reason why preferably the "Expression 11" described above is satisfied as for the upper insulating layer 36 to suppress charge trapping in the trapping layer 36b during standby time and enhance electron trapping at the erasing trap pulse is as follows:

To suppress charge trapping in the trapping layer 36b during standby time, preferably the Fermi level of the control gate 7 is positioned on the lower energy side than the trap level of the trapping layer 36b during standby time. Therefore, to suppress charge trapping in the trapping layer 36b during standby time, letting the work function of the control gate 7 be Φ and the trap level of the trapping layer 36b with the vacuum level as the reference be φ, preferably the following expression is satisfied:

$$0 < \Phi - \phi \quad \text{(Expression 12)}$$

On the other hand, since an electron needs to be trapped at the trap level of the trapping layer 36b at the erasing operation, preferably the work function of the control gate 7 exceeds the trap level of the trapping layer 36b at the erasing operation. Therefore, letting the maximum value of voltage drop of the trap level of the trapping layer 36b in an erase bias be Vf, preferably the following expression is satisfied:

$$\Phi - (\phi + Vf) \leq 0 \quad \text{(Expression 13)}$$

Letting the electric potential difference between the channel region and the control gate 7 at the erasing operation be $V_{erase}$, the maximum value of voltage drop of the trap level of the trapping layer 36b according to the erase bias, Vf, is given according to the following expression:

$$Vf = (EOT_1 + EOT_2)/(EOT_{total}) \times V_{erase} \quad \text{(Expression 14)}$$

From "Expression 12", "Expression 13", and "Expression 14", $$0 < \Phi - \phi \leq (EOT_1 + EOT_2)/(EOT_{total}) \times V_{erase} \quad \text{(Expression 15)}$$

Thus, it is preferable to satisfy the "Expression 11" as for the upper insulating layer 36 to suppress charge trapping in the trapping layer 36b during standby time and enhance electron trapping at the erasing trap pulse.

If the control gate 7 is made of polysilicon, "electron affinity" corresponds to the "work function" and a similar expression can be used.

Figure 6A:
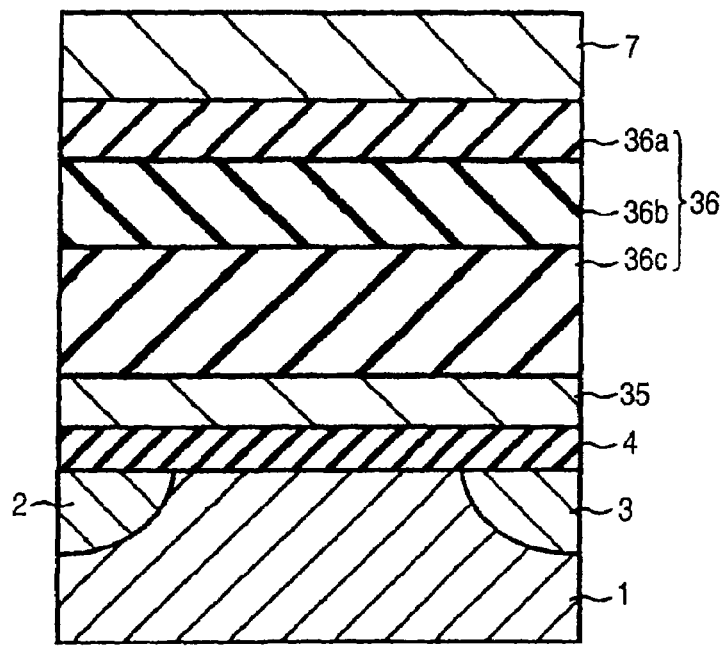
FIGS. 6A and 6B are step sectional views to show a manufacturing method of the nonvolatile semiconductor memory element according to the third embodiment.
Figure 6B:
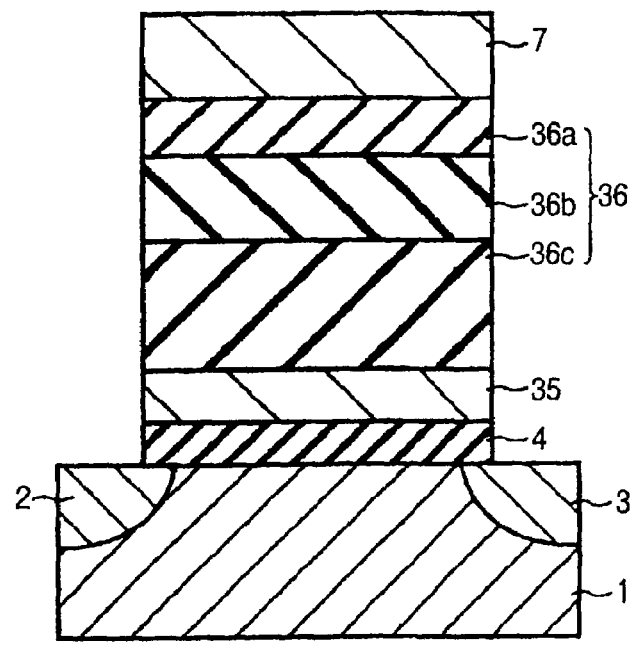

Next, a manufacturing process of the nonvolatile semiconductor memory element according to the embodiment will be discussed with reference to FIGS. 6A and 6B. FIGS. 6A and 6B are step sectional views to show the manufacturing process of the nonvolatile semiconductor memory element.

First, as shown in FIG. 6A, as in the first embodiment, an n⁺-type source region 2 and drain region 3 are formed in the surface of a p⁻-type semiconductor substrate 1. Next, an insulating film which will become a tunnel insulating film 4 is formed on entire top surface of the p⁻-type semiconductor substrate 1. As the insulating film, a silicon oxide film is formed by thermal oxidation, for example. The silicon oxide film is formed in a film thickness of 2 to 10 nm, for example. Next, for example, silicon nitride is deposited on the silicon oxide film by a CVD method to form a silicon nitride film which will become a non-conductive charge storage layer 35. The silicon nitride film is formed in a thickness of 2 to 20 nm, for example. Next, for example, SiO₂ is deposited on the silicon nitride film by the CVD method to form an SiO₂ film which will become a blocking layer 36c. Next, for example, SiN is deposited on the blocking layer 36c by the CVD method to form an SiN film which will become a trapping layer 36b. Next, for example, SiO₂ is deposited on the trapping layer 36b by the CVD method to form an SiO₂ film which will become a transmitting layer 36a. For the films, the trap level density is increased or decreased according to the film formation condition as in the first embodiment. When the trapping layer 36b is formed, the trap level density can also be increased by lowering the film formation temperature as in the first embodiment. Next, for example, polysilicon is deposited by the CVD method to form a polysilicon film. The polysilicon film is formed in a film thickness of 5 to 100 nm, for example.

Next, as shown in FIG. 6B, lithography is executed for the laminated structure made up of the silicon oxide film, the silicon nitride film, the SiO₂ film, the SiN film and the polysilicon film, thereby partially exposing the source region 2 and the drain region 3. Consequently, the laminated structure is formed wherein the tunnel insulating film 4 formed of the silicon oxide film, the non-conductive charge storage layer 35 formed of the silicon nitride film, the blocking layer 36c formed of the SiO₂ film, the trapping layer 36b formed of the SiN film, the transmitting layer 6a formed of the SiO₂ film and the control gate 7 formed of the polysilicon film are deposited in order. The described manufacturing process is executed, thereby forming the nonvolatile semiconductor memory element according to the third embodiment shown in FIG. 5.

Next, an erasing operation in the nonvolatile semiconductor memory element according to the third embodiment will be discussed. At the erasing operation, a voltage is applied so that the control gate 7 becomes a negative voltage relative to the semiconductor substrate 1 and a hole is injected into the non-conductive charge storage layer 35 from the semiconductor substrate 1. The absolute value of the voltage applied between the control gate 7 and the semiconductor substrate 1 at the erasing operation exceeds 0 MV/cm as the equivalent oxide field and is equal to or less than 25 MV/cm and the time is in the range of 1 ns to 10 ms. More preferably, the equivalent oxide field is in the range of 10 MV/cm to 25 MV/cm and the time is in the range of 1 ns to 0.1 ms.

At this time, an electron is injected into the trapping layer 36b from the control gate 7 and is trapped. The upper insulating layer 36 traps the electron, so that the leak current passing through the upper insulating layer 36 from the control gate 7 is suppressed. In the third embodiment, since the electron is trapped in the upper insulating layer 36 at the erasing operation, an erasing trap pulse is applied to inject the electron. Next, a first detrap pulse different in polarity from the above-mentioned voltage is applied. In the first detrap pulse, at least either the absolute voltage value or the first detrap pulse applying time is smaller than the operating voltage at the erasing trap pulse. As the first detrap pulse, more preferably the equivalent oxide field exceeds 0 MV/cm and is equal to or less than 10 MV/cm and the time is in the range of 1 ns to 0.1 ms. The first detrap pulse is applied, whereby the electron trapped in the upper insulating layer 36 at the erasing trap pulse is emitted to the control gate 7. In the embodiment, the upper insulating layer 36 adopts the laminated structure of the blocking layer 36c, the trapping layer 36b and the transmitting layer 36a, and the leak current characteristic of the transmitting layer 36a is made higher than that of the blocking layer 36c, so that an electron is effectively emitted from the upper insulating layer 36 to the control gate 7 by applying the first detrap pulse. The principle of enabling an electron to be effectively emitted from the upper insulating layer 36 to the control gate 7 is similar to that described in the first embodiment. That is, since the transmitting layer 36a has the high leak current characteristic, when the first detrap pulse is applied, an electron is effectively emitted from the trapping layer 36b through the transmitting layer 36a to the control gate 7, and on the other hand, electron injection into the trapping layer 36b through the blocking layer 36c from the non-conductive charge storage layer 35 is suppressed because the leak current characteristic of the blocking layer 36c is low.

When the first detrap pulse is applied, excessive holes may be trapped in the trapping layer 36b. If the excessively trapped holes are emitted at the standby time, threshold fluctuation is caused to occur and reliability is degraded. Thus, a second detrap pulse of the same polarity as the erasing trap pulse is applied as required after the first detrap pulse is applied. The second detrap pulse is applied, whereby electrons is injected into the upper insulating layer 36 to cancel out the excessive holes in the upper insulating layer 36. The electron amount injected into the upper insulating layer 36 in the second detrap pulse application time needs to be smaller than that in the erasing trap pulse application time. Therefore, at least either the absolute voltage value or the time length of the second detrap pulse needs to be smaller than the erasing trap pulse. As the second detrap pulse, more preferably, the equivalent oxide field exceeds 0 MV/cm and is equal to or less than 10 MV/cm, and the time is in the range of 1 ns to 0.1 ms.

In the embodiment, by performing the described operation, charge emission at the data retaining time from the upper insulating layer 36 is prevented, the threshold fluctuation during the data retaining time is suppressed, and the reliability is enhanced. Particularly, as described above, in the embodiment, the upper insulating layer 36 adopts the laminated structure (three-layer structure) of the blocking layer 36c, the trapping layer 36b and the transmitting layer 36a, and the leak current characteristic of the transmitting layer 36a is made higher than that of the blocking layer 36c, so that an electron is effectively emitted from the upper insulating layer 36 to the control gate 7 by applying the first detrap pulse.

As the described operation is performed, according to the nonvolatile semiconductor memory element according to the third embodiment, an electron is trapped in the trapping layer 36b at the erasing operation, whereby the electric field applied on the upper insulating layer 36 is weakened and the electric field applied on the tunnel insulating film 4 and the non-conductive charge storage layer 35 is strengthened. Consequently, electron emission from the non-conductive charge storage layer 35 to the semiconductor substrate 1 and hole injection into the non-conductive charge storage layer 35 from the semiconductor substrate 1 are performed efficiently. An electron is trapped in the trapping layer 36b, whereby the electron barrier of the insulating film from the control gate 7 to the trapping layer 36b is increased. Accordingly, it is made possible to improve the erasing operation speed and decrease the operating voltage. Particularly, in the upper insulating layer 36 according to the embodiment, the film thickness of the transmitting layer 36a is thinner than that of the blocking layer 36c, and thus the leak current characteristic of the transmitting layer 36a is larger than that of the blocking layer 36c. Therefore, when the erasing trap pulse is applied, the transmitting layer 36a allows an electric current to well flow as compared with the blocking layer 36c, so that more electrons are trapped in the trapping layer 36b having a higher trap level density, so that the electrons are trapped in the trapping layer 36b effectively.

The blocking layer 36c also suppresses charge move between the non-conductive charge storage layer 35 and the trapping layer 36b during the write operation, the erasing operation, and the data retaining time.

In the third embodiment, after a first detrap pulse is applied, a second detrap pulse of a different polarity from the first detrap pulse is applied, whereby the hole injected into the trapping layer 36b at the first detrap pulse is canceled out. According to the operation, hole emission from the trapping layer 36b at the data retaining time is prevented, and the threshold fluctuation during the data retaining time is suppressed.

Fourth Embodiment

Figure 7:
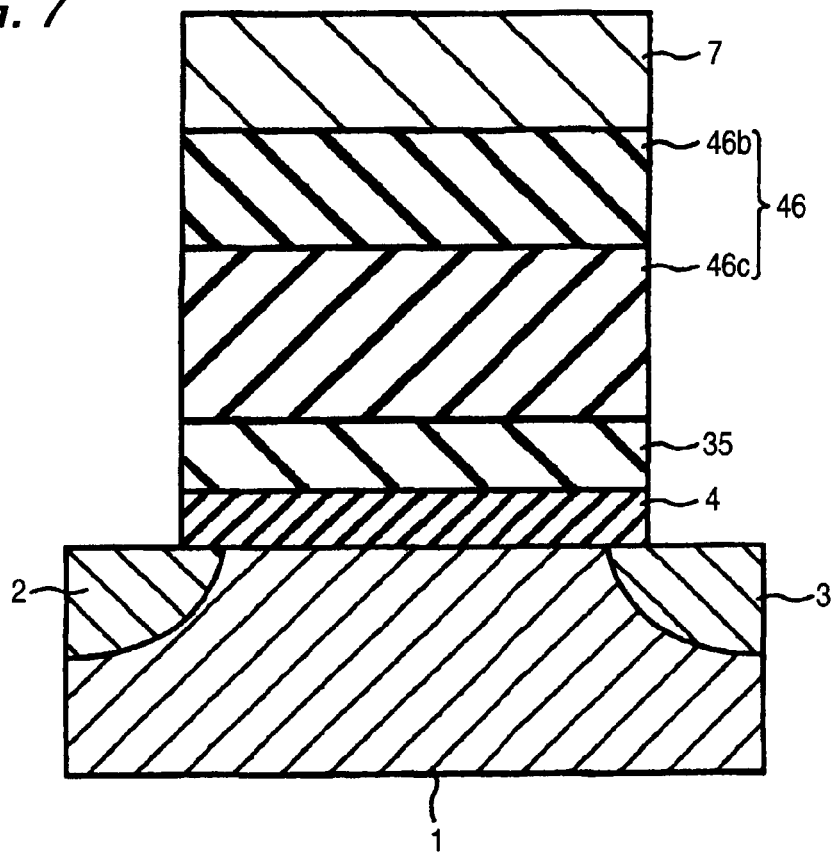
FIG. 7 is a sectional view to show the structure of a nonvolatile semiconductor memory element according to a fourth embodiment of the invention.

FIG. 7 is a sectional view to show a nonvolatile semiconductor memory element according to a fourth embodiment of the invention.

The nonvolatile semiconductor memory element according to the fourth embodiment differs in that an upper insulating layer 46 has a two-layer structure of a blocking layer 46c and a trapping layer 46b from the nonvolatile semiconductor memory element according to the third embodiment wherein the upper insulating layer 36has the three-layer structure of the blocking layer 36c, the trapping layer 36b and the transmitting layer 36a.

That is, the nonvolatile semiconductor memory element according to the fourth embodiment has a structure wherein a source region 2 and a drain region 3 of second conduction type, such as $n^+$ type, formed at a distance from each other are formed in a semiconductor substrate 1 of first conduction type, such as $p^-$ type. In the structure, a tunnel insulating film 4, a non-conductive charge storage layer 35, the above-mentioned upper insulating layer 46 and a control gate 7 are deposited on a channel region of the surface of the $p^-$-type semiconductor substrate 1. The tunnel insulating film 4, the non-conductive charge storage layer 35 and the control gate 7 have thicknesses of 2 to 10 nm, 2 to 20 nm and 5 to 100 nm respectively, for example. The upper insulating layer 46 has the two-layer structure wherein the blocking layer 46c and the trapping layer 46b are deposited in order on the non-conductive charge storage layer 35. The blocking layer 46c and the trapping layer 46b have thicknesses of 4 to 20 nm and 1 to 5 nm respectively, for example.

Material of the upper insulating layer 46, namely, the blocking layer 46c and the trapping layer 46b will be discussed below: As the material of the blocking layer 46c, material having a small trap level density as compared with that of the trapping layer 46b is used. The same material as shown in the first embodiment can be used as the material of the blocking layer 46c and the trapping layer 46b.

The preferred material combinations of the blocking layer 46c and the trapping layer 46b are shown below as in the form of blocking layer 46c/trapping layer 46b: For example, $Al_2O_3$/SiN, $Al_2O_3$/HfAlO, $Al_2O_3$/ZrAlO, $Al_2O_3$/TiAlO, $Al_2O_3$/HfSiO and $Al_2O_3$/ZrSiO. As for these combinations, $SiO_2$ may be changed to SiON or SiN, $Al_2O_3$ may be changed to $SiO_2$, and $SiO_2$ may be changed to $Al_2O_3$.

As for the upper insulating layer 46, preferably the following expression is satisfied for suppressing charge trapping in the trapping layer 46b during standby time and charge trapping effectively at the erasing operation. The following expression can be derived by assigning $EOT_1=0$ in the third embodiment:

$$0 < \Phi - \phi \leq (EOT_2)/(EOT_{total}) \times V_{erase} \quad \text{(Expression 16)}$$

A manufacturing process of the nonvolatile semiconductor memory element according to the embodiment differs from the third embodiment in that the control gate 7 is formed on the trapping layer 46b and the transmitting layer is not formed on the trapping layer 46b.

Next, an erasing operation in the nonvolatile semiconductor memory element according to the fourth embodiment and a detrapping operation for detrapping an electron from the upper insulating layer 46 will be discussed. The erasing operation is similar to those of the third embodiment. In the fourth embodiment, the upper insulating layer 46 adopts the two-layer structure made up of the blocking layer 46c on the non-conductive charge storage layer 35 side and the trapping layer 46b having the large charge trap level density as compared with that of the blocking layer 46c on the control gate 7 side. In the fourth embodiment, charge is effectively emitted from the upper insulating layer 46 by applying the first detrap pulse. The principle of enabling charge to be effectively emitted from the upper insulating layer 46 is similar to that described in the second embodiment. That is, the structure according to the embodiment is adopted, whereby when the erasing trap pulse is applied, an electron is easily injected into the upper insulating layer 46 from the control gate 7, and on the other hand, when the detrap pulse is applied, charge move from the non-conductive charge storage layer 35 to the upper insulating layer 46 is suppressed. Consequently, the electron trapped in the upper insulating layer 46 at the erasing operation is effectively detrapped by applying the first detrap pulse.

As described above, according to the fourth embodiment, the two-layer structure of the upper insulating layer 46 made up of the blocking layer 46c on the non-conductive charge storage layer 35 side and the trapping layer 46b having the large electron trap level density as compared with that of the blocking layer 46c on the control gate 7 side is adopted, whereby the electron trapped in the upper insulating layer 46 at the erasing operation is effectively detrapped by applying the first detrap pulse. Therefore, charge emission through the upper insulating layer 46 at the data retaining time is prevented, and the threshold fluctuation during the data retaining time is suppressed.

In the embodiment, after a first detrap pulse is applied, a second detrap pulse of a different polarity from the first detrap pulse is applied, whereby the hole injected into the trapping layer 46b at the first detrap pulse is detrapped in the control gate 7, hole emission through the upper insulating layer 46 at the data retaining time is prevented, the threshold fluctuation during the data retaining time is suppressed, and the reliability is enhanced.

According to the fourth embodiment, an electron is trapped in the trapping layer 46b at the erasing trap pulse, whereby the electric field applied on the upper insulating layer 46 is weakened and the electric field applied on the tunnel insulating film 4 and the non-conductive charge storage layer 35 is strengthened. Consequently, electron emission from the non-conductive charge storage layer 35 to the semiconductor substrate 1 and hole injection into the non-conductive charge storage layer 35 from the semiconductor substrate 1 are performed efficiently, and it is made possible to improve the erasing operation speed and decrease the operating voltage.

Fifth Embodiment

Figure 8:
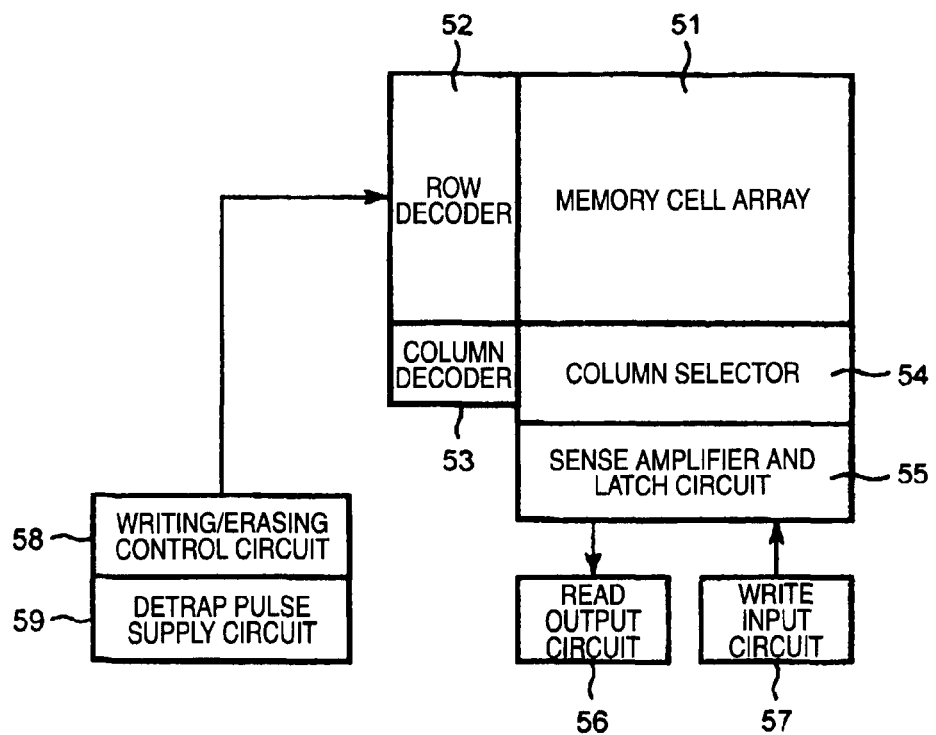
FIG. 8 is a block diagram to show NAND-type flash memory according to a fifth embodiment of the invention.

FIG. 8 is a block diagram to show NAND-type flash memory as nonvolatile semiconductor memory according to a fifth embodiment of the invention. As shown in FIG. 8, the nonvolatile semiconductor memory according to the embodiment includes a memory cell array 51 formed by arranging the nonvolatile semiconductor memory elements, for example, according to the first embodiment and a detrap pulse supply circuit 59 for supplying a detrap pulse to the control gate 7 of a memory cell for pulling out charge from the upper insulating layer 6 after data is written into the nonvolatile semiconductor memory element.

As shown in FIG. 8, the NAND-type flash memory according to the fifth embodiment is made up of the memory cell array 51, a row decoder 52, a column decoder 53, a column selector 54, a sense amplifier and latch circuit 55, a read output circuit 56, a write input circuit 57, a writing/erasing control circuit 58 for supplying a required writing/erasing voltage or pulse signal in accordance with the operation mode and the detrap pulse supply circuit 59. The detrap pulse supply circuit 59 may be formed in the writing/erasing control circuit 58.

After data is written by injecting charge of a first polarity into the conductive charge storage layer 5 from the semiconductor substrate 1 by applying a voltage to a memory cell, the detrap pulse supply circuit 59 supplies a detrap pulse of applying a voltage of a different polarity from the voltage applied at the writing operation between the control gate 7 and the semiconductor substrate 1 of the nonvolatile semiconductor memory element for emitting the charge of the first polarity trapped in the upper insulating layer 6 at the writing trap pulse from the upper insulating layer 6. After applying the detrap pulse, the detrap pulse supply circuit 59 may further apply a second detrap pulse. The second detrap pulse is a voltage of the same polarity as the voltage at the writing operation. The second detrap pulse is applied, whereby the charge of the first polarity is injected into the upper insulating layer 6 into which the charge of the second polarity is injected at the first detrap pulse, thereby canceling out the excessive charge of the second polarity.

Figure 9:
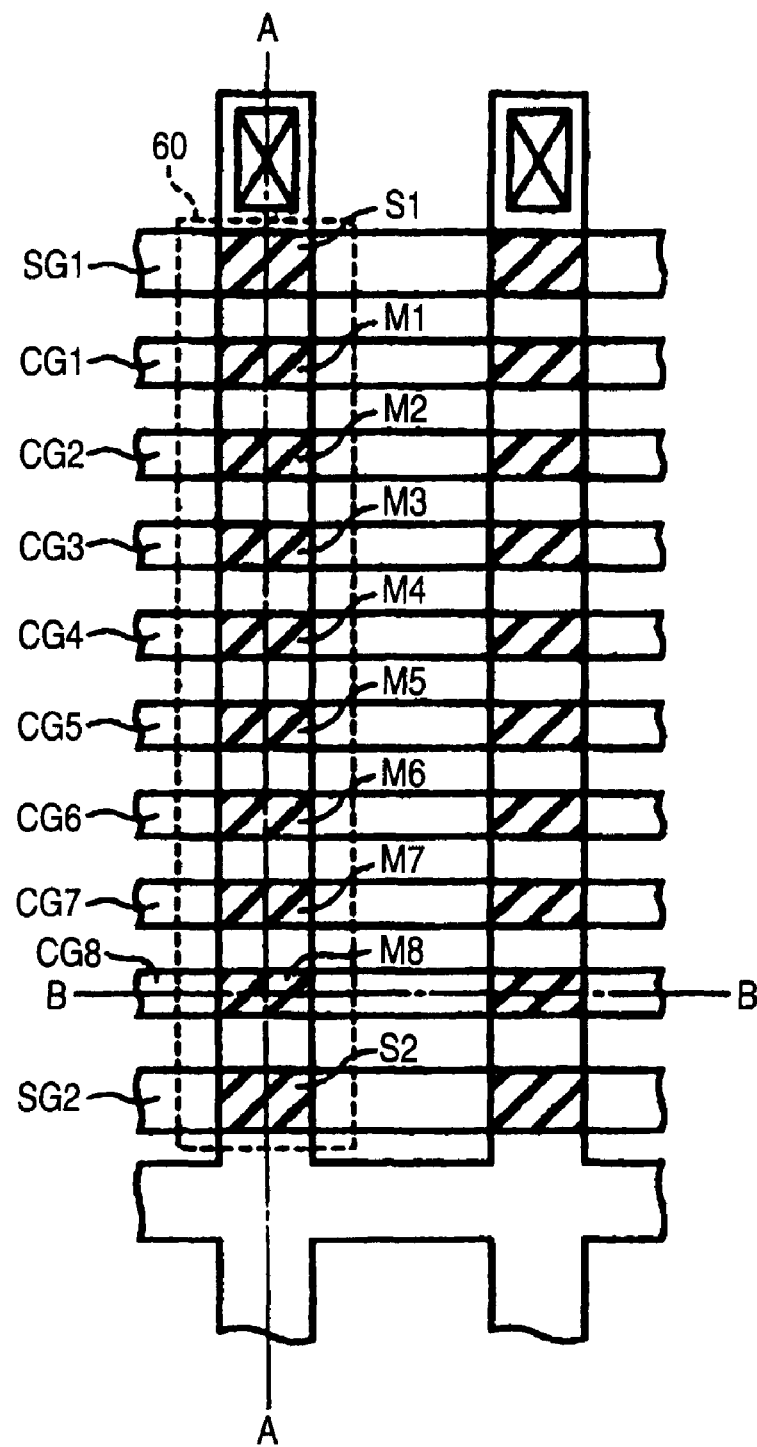
FIG. 9 is a pattern plan view of a part of a memory cell array of the nonvolatile semiconductor memory according to the fifth embodiment.
Figure 10:
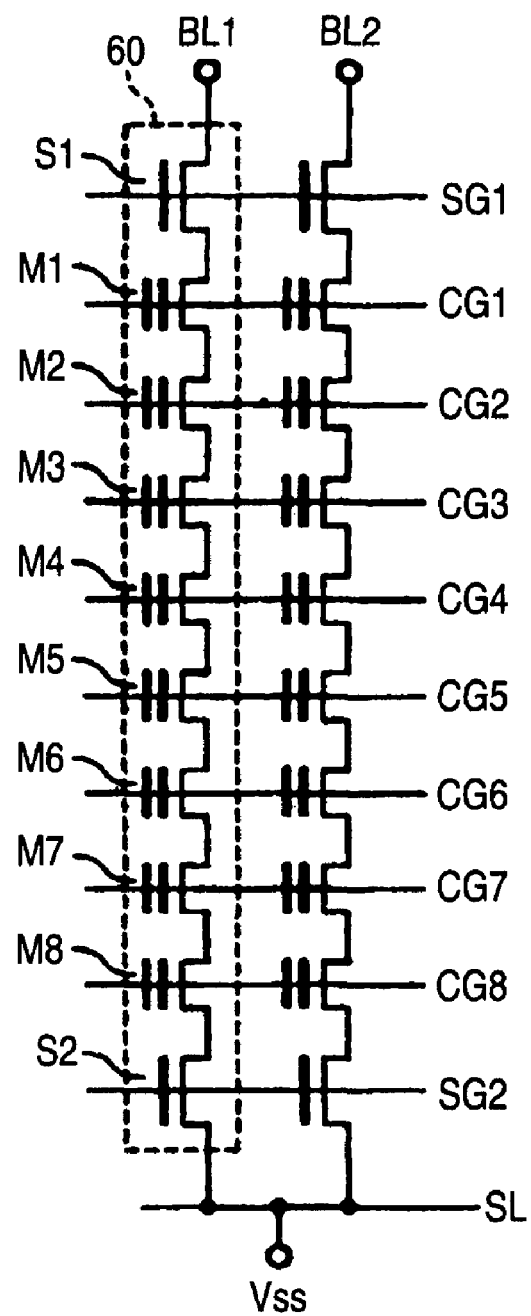
FIG. 10 is an equivalent circuit diagram of the memory cell array of the nonvolatile semiconductor memory according to the fifth embodiment.

Next, the memory cell array 51 in FIG. 8 will be discussed. FIG. 9 is a pattern plan view of a part of the memory cell array 51. In the embodiment, memory implementing the memory cell array 51 is formed of the nonvolatile semiconductor memory elements according to the first embodiment. In FIG. 9, bit lines are not shown. FIG. 10 is an equivalent circuit diagram of the memory cell array 51 shown in FIG. 9. In the memory cell array 51 shown in FIGS. 9 and 10, each NAND cell unit 60 includes cell transistors M1 to M8 connected in series and select transistors S1 and S2 placed at both ends of the cell transistors. Select gate lines SG1 and SG2 are connected to gates of the select transistors S1 and S2, and control gate 7 lines (word lines) CG1 to CG8 are connected to the control gates 7 of the memory cells M1 to M8. Bit lines BL1, BL2, . . . are connected to a drain of the select transistor S1 of each NAND cell unit 60, and a source line SL is connected to a source of the select transistor S2. Although eight cell transistors are connected in series in the embodiment, the number of the cell transistors is not limited to eight; for example, it may be 16 or 32.

A writing operation and a detrapping operation according to the nonvolatile semiconductor memory according to the embodiment are similar to those of the first embodiment.

According to the nonvolatile semiconductor memory according to the embodiment, advantages similar to those of the first embodiment can be accomplished.

In the fifth embodiment, the memory cell array provided by arranging the nonvolatile semiconductor memory elements according to the first embodiment has been described, but the memory cell array may be provided by arranging the nonvolatile semiconductor memory elements according to any of the second to fourth embodiments. A detrap pulse supply circuit for a memory cell array provided by arranging the nonvolatile semiconductor memory elements according to the third or fourth embodiment is used will be discussed. After data is erased by emitting charge having a first polarity from the non-conductive charge storage layer 5 to the semiconductor substrate 1 by applying a voltage, the detrap pulse supply circuit supplies a detrap pulse having a polarity different from the erasing trap pulse to the control gate 7 for emitting the first polarity charge trapped in the upper insulating layer 36 at the erasing trap pulse therefrom. After applying the detrap pulse, the detrap pulse supply circuit may further apply a second detrap pulse. The second detrap pulse has the same polarity as the erasing operation voltage. The second detrap pulse is applied, whereby the excessive charge of the second polarity which is trapped at the first detrap pulse, is detrapped from the upper insulating layer 36.

It is to be understood that the invention is not limited to the first to fifth embodiments described above and that the invention can be embodied in various modifications without departing from the spirit and scope of the invention. The embodiments described above may be combined as required. For example, some components may be deleted from all components disclosed in the embodiments described above.

In the first to fifth embodiments, the upper insulating layer adopting the two-layer or three-layer structure have been described. However, the upper insulating layer is not limited to the two-layer or three-layer structure. For example, the upper insulating layer may adopt a four-or-more-layer structure.

The upper insulating layer may be formed of one layer. When the upper insulating layer is formed of one layer, for example, it may adopt a structure wherein the electron trap level density is changed continuously along the film thickness direction. For example, to continuously lessen the electron trap level density along the film thickness direction from the conductive charge storage layer 5 to the control gate 7, the upper insulating layer can be formed by lessening the difference of the constituent-element composition ratio of the upper insulating layer from the stoichiometric ratio from the conductive charge storage layer 5 to the control gate 7. Such a structure is adopted, whereby the amount of electron injected into the upper insulating layer from the control gate 7 is small as compared with the amount of electron emitted from the upper insulating layer to the conductive charge storage layer 5 at the first detrap pulse. Consequently, the electron trapped in the upper insulating layer at the writing operation can be effectively detrapped by applying the first detrap pulse. Therefore, at the data retaining time, charge emission through the upper insulating layer and the threshold fluctuation can be suppressed.

In the first to fifth embodiments, the electrically writable and erasable nonvolatile semiconductor memory element, particularly, the NAND-type flash memory has been shown. However, the invention can also be applied to NOR-type, AND-type, and DINOR type nonvolatile semiconductor memory elements, NANO-type flash memory into which the merits of the NOR type and the NAND type are merged, a 3Tr-NAND-type nonvolatile semiconductor memory element having a structure wherein one memory element is sandwiched between two select transistors, and the like.

In the first to fifth embodiments, the specific shapes, the specific sizes, and the specific materials have been shown, but the shapes, the sizes and the materials in the embodiments are shown by way of example; any other shape, size and material may be adopted without departing from the spirit and scope of the invention as long as the advantages of the invention can be demonstrated.

For example, in the first to fifth embodiments, the laminated structure is provided on the Si substrate. However, the laminated structure need not be formed on the Si substrate. For example, the laminated structure can also be formed on a well formed on the Si substrate, an SiGe substrate, a Ge substrate, an SiGeC substrate, an SOI (silicon on insulator) substrate formed with a thin-film semiconductor on an insulating film, an SGOT (silicon-germanium on insulator) substrate, or a well formed on any of the substrates.

In the first to fifth embodiments, the channel region is formed in a flat structure. However, the channel region need not necessarily be flat. For example, the channel region may be formed in a three-dimensional structure, such as an FIN structure.

In the first to fifth embodiments, the elements are two-dimensionally arranged. However, the elements need not necessarily be two-dimensionally arranged. For example, a laminated structure or a vertical structure may be adopted as the element arrangement.

The operation bias signs in the embodiments are shown by assuming an n-channel transistor on a p-type substrate, but the invention is also effective for an n-type substrate. To use the n-type substrate, the operation bias signs may be made opposite.

In the first to fifth embodiments, the source region 2 and the drain region 3 are n-type regions. However, the source region 2 and the drain region 3 may be p-type regions. Further, the source region 2 and the drain region 3 may be a metal-contained conductive regions, such as a metal and a metal silicide. As the metal silicide, nickel silicide and cobalt silicide may be used, for example.

Although, in the first to fourth embodiments, the source and drain regions are formed before the gate laminated structure is formed, the source and drain regions may be formed after the gate laminated structure have been formed by use of the gate laminated structure as a mask.

According to an aspect of the present invention, charge emission from the upper insulating layer of the nonvolatile semiconductor memory element at the data retaining time can be effectively suppressed and threshold fluctuation during the data retaining time in the nonvolatile semiconductor memory element can be effectively suppressed.

According to another aspect of the present invention, there may be provided a method for controlling a nonvolatile semiconductor memory element including: a semiconductor substrate including: a source region that is formed in the semiconductor substrate; a drain region that is formed in the semiconductor substrate; and a channel region that is sandwiched between the source region and the drain region; a lower insulating film that is formed on the channel region; a conductive charge storage film that is formed on the lower insulating film and that stores data; an upper insulating film including: a first insulating film that is formed on the conductive charge storage film; and a second insulating film that is formed on the first insulating film; and a control gate that is formed on the upper insulating film, wherein the first insulating film is formed to have a trap level density larger than that of the second insulating film, the method including: applying a voltage having a second polarity between the control gate and the semiconductor substrate, thereby injecting a charge having a first polarity opposite to the second polarity into the conductive charge storage film from the semiconductor substrate and trapping the charge having the first polarity in the first insulating film; and applying a voltage having the first polarity between the control gate and the semiconductor substrate, thereby emitting the charge having the first polarity trapped in the first insulating film from the first insulating film to the conductive charge storage film.

According to still another aspect of the present invention, there may be provided a method for controlling a nonvolatile semiconductor memory element including: a semiconductor substrate including: a source region that is formed in the semiconductor substrate; a drain region that is formed in the semiconductor substrate; and a channel region that is sandwiched between the source region and the drain region; a lower insulating film that is formed on the channel region; a non-conductive charge storage film that is formed on the lower insulating film and that stores data; an upper insulating film including: a second insulating film that is formed on the non-conductive charge storage film; and a first insulating film that is formed on the second insulating film; and a control gate that is formed on the upper insulating film, wherein the first insulating film is formed to have a trap level density larger than that of the second insulating film, the method including: applying a voltage having a first polarity between the control gate and the semiconductor substrate, thereby emitting a charge having the first polarity from the non-conductive charge storage film to the semiconductor substrate and trapping the charge having the first polarity in the first insulating film; and applying a voltage having a second polarity opposite to the first polarity between the control gate and the semiconductor substrate, thereby emitting the charge having the first polarity trapped in the first insulating film from the first insulating film to the control gate.

What is claimed is:

1. A nonvolatile semiconductor memory element comprising:
   a source region;
   a drain region ;
   a channel region that is sandwiched between the source region and the drain region;
   a lower insulating film that is formed on the channel region;
   a charge storage film that is formed on the lower insulating film and that stores data;
   an upper insulating film that is formed on the charge storage film; and
   a control gate that is formed on the upper insulating film,
   wherein the upper insulating film includes:
      a first insulting film;
      a second insulating film that is laminated with the first insulating film; and
      a third insulating film, wherein the first insulating film is provided between the third insulating film and the second insulating film;
   wherein the first insulating film is formed to have a trap level density larger than that of the second insulating film.

2. The nonvolatile semiconductor memory element according to claim 1,
   wherein the second insulating film includes at least one film selected from a group consisting of:
      an $SiO_2$ film;
      an SiON film;
      an SiN film;
      an $Al_2O_3$ film; and
      an LaAlSiO film.

3. The nonvolatile semiconductor memory element according to claim 1,
   wherein the first insulating film includes the same constituent element as the second insulating film, and
   wherein the first insulating film has a constituent element composition ratio larger in a difference from the stoichiometric ratio than that of the second insulating film.

4. The nonvolatile semiconductor memory element according to claim 1,
   wherein the first insulating film includes an SiN film.

5. The nonvolatile semiconductor memory element according to claim 1,
   wherein the first insulating film includes a constituent element of the second insulating film and Hf.

6. The nonvolatile semiconductor memory element according to claim 1,
   wherein the first insulating film includes a constituent element of the second insulating film and Zr.

7. The nonvolatile semiconductor memory element according to claim 1,
   wherein the first insulating film includes at least one film selected from a group consisting of:
      an oxide film of Ti, Y, Zr, or Hf;
      a nitride film of Ti, Y, Zr, or Hf; and
      an oxynitride film of Ti, Y, Zr, or Hf.

8. The nonvolatile semiconductor memory element according to claim 1,
   wherein the third insulating film has a thickness thinner than that of the second insulating film.

9. The nonvolatile semiconductor memory element according to claim 8,
   wherein the third insulating film has a trap level density smaller than that of the first insulating film.

10. The nonvolatile semiconductor memory element according to claim 1,
    wherein the third insulating film includes the same constituent element as the first insulating film, and
    wherein the third insulating film has a constituent element composition ratio smaller in a difference from the stoichiometric ratio than that of the first insulating film.

11. The nonvolatile semiconductor memory element according to claim 1,
    wherein the third insulating film includes the same material as the second insulating film.

12. The nonvolatile semiconductor memory element according to claim 1,
    wherein the third insulating film includes an $SiO_2$ film.

13. The nonvolatile semiconductor memory element according to claim 1,
    wherein the charge storage film includes a conductive charge storage film,
    wherein the second insulating film is provided between the first insulating film and the control gate, and
    wherein the third insulating film is provided between the first insulating film and the conductive charge storage film.

14. The nonvolatile semiconductor memory element according to claim 1,
    wherein the charge storage film is a non-conductive charge storage film,
    wherein the second insulating film is provided between the first insulating film and the non-conductive charge storage film, and
    wherein the third insulating film is provided between the first insulating film and the control gate.

15. The nonvolatile semiconductor memory element according to claim 13,
    wherein a voltage $V_{pass}$ is applied on the control gate, the voltage $V_{pass}$ being capable of activating the channel region regardless of whether the conductive charge storage film stores the data,
    wherein the conductive charge storage film has a work function $\Phi$,
    wherein the first insulating film has a trap level $\phi$ with respect to a vacuum level, and
    wherein the third, first and second insulating films respectively have equivalent oxide thicknesses $EOT_1$, $EOT_2$ and $EOT_3$, and
    wherein there is satisfied $$0<(EOT_1+EOT_2)/(EOT_1+EOT_2+EOT_3)<(\Phi-\phi)/V_{pass}.$$

16. The nonvolatile semiconductor memory element according to claim 14, further comprising:
    a semiconductor portion in which the source and drain regions are provided,
    wherein, when an erasing operation is performed, a voltage $V_{erase}$ is applied between the control gate and the semiconductor portion,
    wherein the control gate has a work function $\Phi$,
    wherein the first insulating film has a trap level $\phi$ with respect to a vacuum level, and
    wherein the third and first insulating films respectively have equivalent oxide thicknesses $EOT_1$ and $EOT_2$, wherein the lower insulating film and the non-conductive charge storage film and the upper insulating film have a equivalent oxide thickness $EOT_{total}$, in total, and
wherein there is satisfied $$0 < \Phi - \phi \leq (EOT_1 + EOT_2)/(EOT_{total}) \times V_{erase}.$$

17. A nonvolatile semiconductor memory comprising:
a memory cell array including a plurality of nonvolatile semiconductor memory elements according to claim 13; and
a detrap pulse supply circuit that applies a detrap pulse to the control gate so as to pull out a charge from the first insulating film after the data has been written into the conductive charge storage film.

18. A nonvolatile semiconductor memory comprising:
a memory cell array including a plurality of nonvolatile semiconductor memory elements according to claim 14; and
a detrap pulse supply circuit that applies a detrap pulse to the control gate so as to pull out a charge from the first insulating film after the data has been erased from the non-conductive charge storage film.

* * * * *